US012811388B2

(12) United States Patent
Nakano et al.

(10) Patent No.: US 12,811,388 B2
(45) Date of Patent: Nov. 24, 2026

(54) VEHICLE CONTROL DEVICE

(71) Applicant: Hitachi Astemo, Ltd., Hitachinaka (JP)

(72) Inventors: Hiroshi Nakano, Tokyo (JP); Nobuyasu Kanekawa, Tokyo (JP); Takao Fukuda, Hitachinaka (JP); Kentaro Jumonji, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 449 days.

(21) Appl. No.: 18/560,604

(22) PCT Filed: Feb. 8, 2022

(86) PCT No.: PCT/JP2022/004835
§ 371 (c)(1),
(2) Date: Nov. 13, 2023

(87) PCT Pub. No.: WO2023/281786
PCT Pub. Date: Jan. 12, 2023

(65) Prior Publication Data

US 2024/0258789 A1 Aug. 1, 2024

(30) Foreign Application Priority Data

Jul. 7, 2021 (JP) ................................ 2021-112504

(51) Int. Cl.
*H02H 5/04* (2006.01)
*H02M 1/32* (2007.01)
*H03K 17/08* (2006.01)

(52) U.S. Cl.
CPC .............. *H02H 5/04* (2013.01); *H02M 1/327* (2021.05); *H03K 2017/0806* (2013.01)

(58) Field of Classification Search
CPC ............ H03K 2017/0806; H03K 17/08–0828; H02H 5/04–048; H02H 3/025; H02M 1/327
See application file for complete search history.

(56) References Cited

U.S. PATENT DOCUMENTS 6,724,313 B2 4/2004 Sato et al.
6,759,964 B2 7/2004 Sato et al.
(Continued)

FOREIGN PATENT DOCUMENTS

JP 2003-134795 A 5/2003
JP 2006-180573 A 7/2006
(Continued)

OTHER PUBLICATIONS

International Search Report (PCT/ISA/210) issued in PCT Application No. PCT/JP2022/004835 dated Apr. 5, 2022 with English translation (4 pages).
Japanese-language Written Opinion (PCT/ISA/237) issued in PCT Application No. PCT/JP2022/004835 dated Apr. 5, 2022 with English translation (5 pages).
(Continued)

*Primary Examiner* — Thienvu V Tran
*Assistant Examiner* — Christopher J Clark
(74) *Attorney, Agent, or Firm* — Crowell & Moring LLP

(57) ABSTRACT

A controller includes: a semiconductor switch that controls an operation of a control target to which electric power is supplied from a battery; a temperature detection element that detects an internal temperature of the semiconductor switch as an actual temperature; a temperature estimation unit that estimates the internal temperature as an estimated temperature based on current supplied to the semiconductor switch; a determination unit that outputs a determination result determining heat radiation failure of the semiconductor switch based on a temperature difference between the actual temperature and the estimated temperature; and a drive management unit that manages the operation of the semiconductor switch such that the actual temperature is less than an overtemperature threshold and continues the operation of the semiconductor switch when the determination result that the semiconductor switch has the heat radiation failure is obtained.

14 Claims, 14 Drawing Sheets

(56) References Cited

U.S. PATENT DOCUMENTS

| | | | | |
|---|---|---|---|---|
| 7,046,155 | B2 | 5/2006 | Sato et al. | |
| 8,325,452 | B2 | 12/2012 | Ichikawa | |
| 9,472,940 | B2 | 10/2016 | Nakamura et al. | |
| 9,496,818 | B2 | 11/2016 | Sasaki | |
| 2003/0076232 | A1 | 4/2003 | Sato et al. | |
| 2003/0076233 | A1 | 4/2003 | Sato et al. | |
| 2004/0221217 | A1 | 11/2004 | Sato et al. | |
| 2009/0046405 | A1 | 2/2009 | Ichikawa | |
| 2014/0285131 | A1* | 9/2014 | Sasaki | H02P 29/68 318/490 |
| 2015/0022930 | A1* | 1/2015 | Nakamura | H02H 6/00 361/100 |
| 2018/0102727 | A1* | 4/2018 | Okuaki | G08B 21/187 |
| 2023/0054080 | A1* | 2/2023 | Ott | H02H 3/05 |

FOREIGN PATENT DOCUMENTS

| | | | |
|---|---|---|---|
| JP | 2009-43780 | A | 2/2009 |
| JP | 2010-200426 | A | 9/2010 |
| JP | 2010-226782 | A | 10/2010 |
| JP | 2012-170211 | A | 9/2012 |
| JP | 2014-187789 | A | 10/2014 |
| JP | 2019-120505 | A | 7/2019 |
| WO | WO 2013/161363 | A1 | 10/2013 |

OTHER PUBLICATIONS

Japanese-language Office Action issued in Japanese Application No. 2021-112504 dated Sep. 17, 2024 with English translation (14 pages).

* cited by examiner

VEHICLE CONTROL DEVICE

TECHNICAL FIELD

The present invention relates to a vehicle control device.

BACKGROUND ART

Conventionally, a semiconductor switch using a power semiconductor is used to prevent overheating, smoking, and fire due to overcurrent of an electric or electronic device. Some semiconductor switches have a function for preventing or detecting and protecting the overheating of the semiconductor switch itself by incorporating a current sensor or a temperature sensor. Examples of such the semiconductor switch include an intelligent power module (IPM) and an intelligent power device (IPD).

PTL 1 discloses that "one or a plurality of units include, separately from a first temperature sensor incorporated in the IPM, a second temperature sensor detecting a temperature of the IPM outside the IPM, and a control unit reduces a maximum drive current to a work motor when the unit is an inverter unit when a temperature detection result by the second temperature sensor exceeds a predetermined first threshold lower than a temperature at which an overheat protection function of the IPM is operated by the first temperature sensor".

CITATION LIST

Patent Literature

PTL 1: JP 2010-226782 A

SUMMARY OF INVENTION

Technical Problem

According to the technique disclosed in PTL 1, for example, the temperature sensor outside the IPM detects the temperature outside the IPM before a self-protection function of the IPM operates, whereby a protection operation of a system that uses the unit including the semiconductor switch or the like becomes possible. However, when the protection operation of the system suddenly acts, a function as a vehicle suddenly stops, and there is a risk that safety and convenience of the vehicle are impaired.

With further improvement in vehicle functions in the future, an increase in the number of operations in an electronic control unit (ECU) for automobiles due to integration of control functions and an increase in an amount of heat generated by a vehicle control device due to integration of a power supply function to an actuator are expected. When a thermal shock cycle received by the vehicle control device becomes severe, package degradation of a semiconductor element and degradation of a board mounting material are likely to be generated. When heat radiation of the semiconductor element is degraded due to such the degradation of the member, there is a possibility that sudden function cutoff due to overtemperature is frequently generated.

The present invention has been made in view of such a situation, and an object of the present invention is to continue an operation of a control target even when a heat radiation failure is generated in an operation control unit that controls the operation of the control target.

Solution to Problem

A vehicle control device according to the present invention includes: an operation control unit that controls an operation of a control target to which electric power is supplied from a power supply unit; an actual temperature detection unit that detects an internal temperature of the operation control unit as an actual temperature; a temperature estimation unit that estimates the internal temperature as an estimated temperature based on current supplied to the operation control unit; a determination unit that outputs a determination result determining a heat radiation failure of the operation control unit based on a temperature difference between the actual temperature and the estimated temperature; and a management unit that manages the operation of the operation control unit such that the actual temperature becomes less than an overtemperature threshold and continues the operation of the operation control unit when the determination result that the heat radiation failure is generated in the operation control unit is obtained.

Advantageous Effects of Invention

According to the present invention, even when the heat radiation failure is generated in the operation control unit that controls the operation of the control target, the operation of the control target can be continued.

Problems, configurations, and advantageous effects other than those described above will be clarified by the descriptions of the following embodiments.

DESCRIPTION OF EMBODIMENTS

Figure 1:
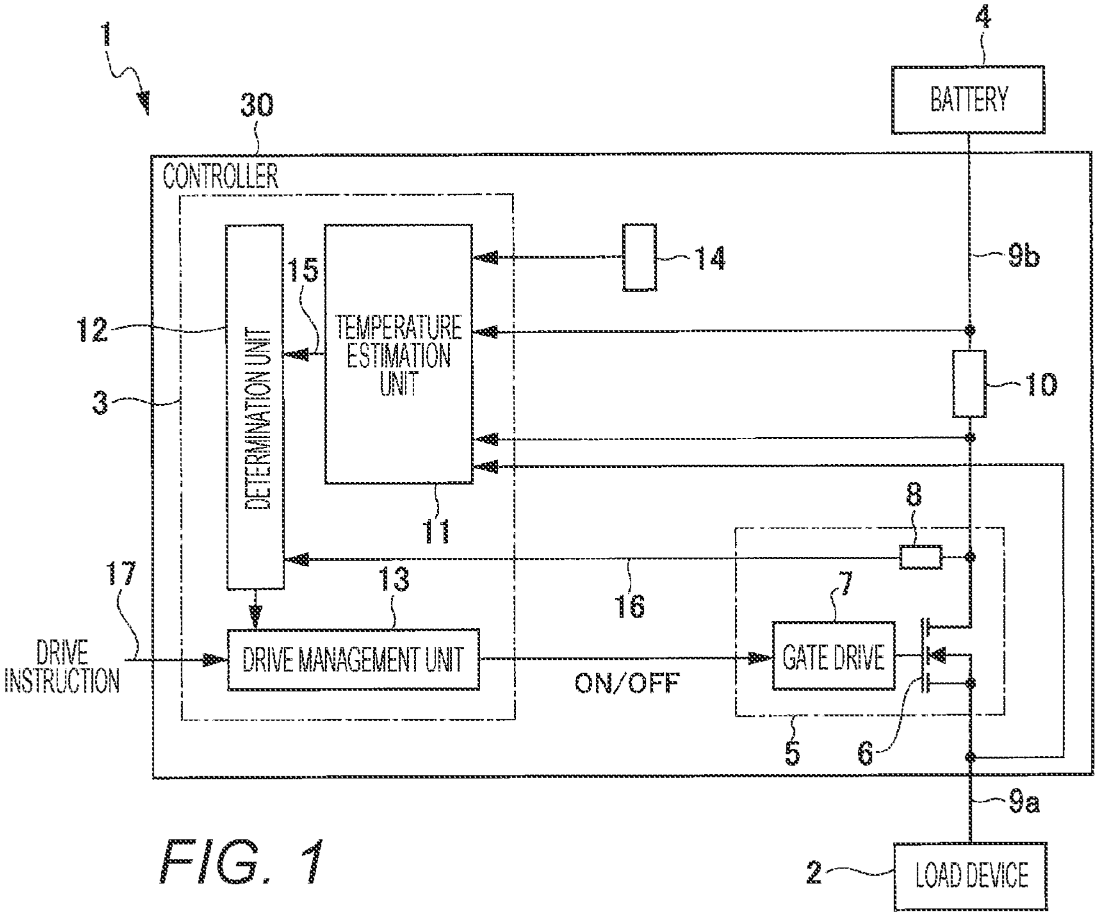
FIG. 1 is a schematic configuration diagram illustrating a power supply system according to a first embodiment of the present invention.

Hereinafter, embodiments of the present invention will be described with reference to the accompanying drawings. In the specification and the accompanying drawings, constituents having substantially the same function or configuration are denoted by the same reference numerals, and overlapping description is omitted.

First Embodiment

FIG. 1 is a schematic configuration diagram illustrating a power supply system 1 according to a first embodiment of the present invention. For example, the power supply system 1 mounted on a vehicle is configured as an automobile engine ECU or a part of an in-vehicle integrated ECU.

The power supply system 1 includes a load device 2, a battery 4, and a controller 30.

For example, the battery 4 is a chargeable/dischargeable secondary battery. The battery 4 supplies electric power to the load device 2.

The load device 2 is a device driven by the electric power. Examples of the load device 2 include actuators such as a lamp, a compressor, a PTC heater, a cooling pump motor, and a fan motor of the vehicle. In the following description, sometimes the load device 2 is referred to as an actuator.

The controller 30 is an example of a vehicle control device that is mounted on the vehicle to control an operation of the vehicle. The controller 30 includes a control unit 3, a semiconductor switch 5, a shunt resistor 10, and a temperature sensor 14.

The control unit 3 outputs an operation instruction of the load device 2 while controlling the electric power supplied to the load device 2. For example, the control unit 3 is configured of a microcomputer in which a central processing unit (CPU), a read only memory (ROM), a random access memory (RAM), and the like are integrated. The CPU reads a program code of software implementing each function of the first embodiment from the ROM, loads the program code into the RAM, and executes the program code. Variables, parameters, and the like generated during arithmetic processing of the CPU are temporarily written in the RAM, and these variables, parameters, and the like are appropriately read by the CPU.

The battery 4 supplies the electric power to the load device 2 through a power line 9*b*. One end of the power line 9*b* is connected to the battery 4, and the other end is connected to the shunt resistor 10. A current detection unit (shunt resistor 10) is provided to detect current supplied from a power supply unit (battery 4) to an operation control unit (semiconductor switch 5). For example, an intelligent power device (IPD) is used as the semiconductor switch 5.

The current detection unit of the first embodiment is a shunt resistor (shunt resistor 10) connected in series to a semiconductor switch (semiconductor switch 5). The current of a power line 9*a* controlled by the semiconductor switch 5 can be detected when the current flowing through the shunt resistor 10 is measured.

The configuration of current detection can be simplified using the shunt resistor 10 as the current detection unit.

A power input terminal of the semiconductor switch 5 is connected to the battery 4 through the shunt resistor 10. That is, the shunt resistor (shunt resistor 10) is provided between the power supply unit (battery 4) and the semiconductor switch (semiconductor switch 5). For this reason, the current supplied from the battery 4 to the semiconductor switch 5 can be detected through the shunt resistor 10. One end of the power line 9*a* is connected to an output terminal of the semiconductor switch 5. The other end of the power line 9*a* is connected to a power input terminal of the load device 2. The power line 9*a* branches off and is connected to a temperature estimation unit 11.

A power input terminal of the semiconductor switch 5 is connected to the temperature estimation unit 11 through an input terminal of the control unit 3. That is, voltage across the semiconductor switch 5 is input to the temperature estimation unit 11.

The operation control unit (semiconductor switch 5) controls the operation of a control target (load device 2) to which the electric power is supplied from the power supply unit (battery 4). The operation control unit of the first embodiment is the semiconductor switch (semiconductor switch 5) that controls the electric power supplied to the control target (load device 2). Using the semiconductor switch 5 as the operation control unit, the function of the operation control unit can be implemented by the semiconductor switch 5. The semiconductor switch 5 performs on and off control of the electric power supplied from the battery 4 mounted on a vehicle based on on and off instructions input from a drive management unit 13, and controls the power supply of the load device 2. As described above, the semiconductor switch 5 of the first embodiment includes a power semiconductor 6, a gate drive circuit 7 that outputs an ON or OFF voltage (or current) to a gate terminal of the power semiconductor 6, and a temperature detection element 8 that detects an internal temperature of the power semiconductor 6 as an example.

The temperature sensor 14 detects an ambient temperature of the semiconductor switch 5. The ambient temperature of the semiconductor switch 5 detected by the temperature sensor 14 is a reference for an estimated temperature estimated by the temperature estimation unit 11. A thermistor installed in a vicinity of the semiconductor switch 5 can be used as the temperature sensor 14. In addition to the thermistor, an element capable of detecting a reference temperature with respect to the estimated temperature may be used as the temperature sensor 14.

The control unit 3 includes the temperature estimation unit 11, a determination unit 12, and the drive management unit 13.

A temperature estimation unit (temperature estimation unit 11) estimates the internal temperature as the estimated temperature based on the current supplied to the operation control unit (semiconductor switch 5). The temperature estimation unit (temperature estimation unit 11) detects the current supplied to the semiconductor switch (semiconductor switch 5) based on the voltage across the shunt resistor (shunt resistor 10). In this way, the configuration of the current detection can be simplified using the shunt resistor 10 as the current detection unit detecting the current. The temperature estimation unit (temperature estimation unit 11) estimates the estimated temperature based on a current detection signal output from the current detection unit (shunt resistor 10) and thermal resistance and heat capacity of constituent members of the operation control unit (semiconductor switch 5). For this reason, the temperature estimation unit 11 detects power consumption of the semiconductor switch 5 based on the current detected by the shunt resistor 10 and the voltage across the semiconductor switch 5. Then, the temperature estimation unit 11 outputs estimated temperature information 15 obtained by an arithmetic operation of the internal temperature of the semiconductor switch 5 to the determination unit 12 based on the detected power consumption.

At this point, the temperature estimation unit 11 can estimate a temperature change (for example, +30° C.) with respect to the temperature after activation of the controller 30 based on the power consumption of the power semiconductor 6. The temperature estimation unit 11 can estimate the internal temperature (for example, 55° C.) of the semiconductor switch 5 by adding the estimated temperature change to the ambient temperature (for example, 25° C.) detected by the temperature sensor 14.

As described above, the ambient temperature of the semiconductor switch 5 detected by the temperature sensor 14 is used in the arithmetic operation of the estimated temperature information 15. The ambient temperature of the semiconductor switch 5 is used as the reference temperature for which the determination unit 12 estimates the temperature. A method by which the temperature estimation unit 11 estimates the internal temperature of the semiconductor switch 5 will be described later.

A determination unit (determination unit 12) outputs the determination result by which the heat radiation failure of the operation control unit (semiconductor switch 5) is determined based on a temperature difference between the actual temperature and the estimated temperature. For example, the determination unit 12 outputs the determination result by which whether the semiconductor switch 5 is normal or abnormal is determined based on the estimated temperature acquired from the estimated temperature information 15 and the actual temperature inside the semiconductor switch 5 acquired from the actual temperature information 16 output from the temperature detection element 8 included in the semiconductor switch 5.

An actual temperature detection unit (temperature detection element 8) detects the internal temperature of the operation control unit (semiconductor switch 5) as an actual temperature. The actual temperature detection unit (temperature detection element 8) is any one of a diode element, a resistance element, and a thermistor element that are provided on a semiconductor substrate configuring the semiconductor switch (semiconductor switch 5). For example, temperature dependence of a voltage drop when a forward current flows through the diode element provided on the same substrate as the power semiconductor 6 inside the semiconductor switch 5 can be utilized as the temperature detection element 8. For example, a temperature-dependent resistance element or thermistor element may be used as the temperature detection element 8. A cost configuring the temperature detection element 8 can be reduced using such the element. Details of a method by which the determination unit 12 determines whether the semiconductor switch 5 is normal or abnormal will be described later.

The drive management unit 13 issues the on and off instructions of the semiconductor switch 5 based on an input drive instruction 17. For example, the drive instruction 17 is a signal output from a light switch to the drive management unit 13 when the driver of the vehicle presses the light switch to turn on or off a front light. The on and off instructions output from the drive management unit 13 are input to the gate drive circuit 7 of the semiconductor switch 5, and controls the drive of the load device 2 through the power semiconductor 6.

Then, when a determination result that the operation control unit (semiconductor switch 5) has the heat radiation failure is obtained, a management unit (drive management unit 13) manages the operation of the operation control unit (semiconductor switch 5) such that the actual temperature is less than the overtemperature threshold, and continues the operation of the operation control unit (semiconductor switch 5).

At this point, upon receiving the abnormality determination from the determination unit 12, the drive management unit 13 corrects the drive instruction 17 and outputs the off instruction, thereby limiting the drive of the load device 2 through the power semiconductor 6. When the drive management unit 13 limits the driving of the semiconductor switch 5, the power consumption of the semiconductor switch 5 is restrained, so that the semiconductor switch 5 can be prevented from a breakdown or stop due to the overtemperature. Even when the heat radiation failure of the semiconductor switch 5 is determined in this manner, the semiconductor switch 5 is not immediately cut off, but the operation of the semiconductor switch 5 is continued such that the actual temperature is less than the overtemperature threshold. For this reason, even when the semiconductor switch 5 is degraded, a limit to the operation of the semiconductor switch 5 can be minimized to maintain an important function as a vehicle.

As a method for limiting the drive of the load device 2 by the drive management unit 13, for example, there is a method for decreasing a carrier frequency in a PWM waveform when the load device 2 is driven by pulse width modulation (PWM).

<Method for Estimating Internal Temperature of Semiconductor Switch>

Figure 2:
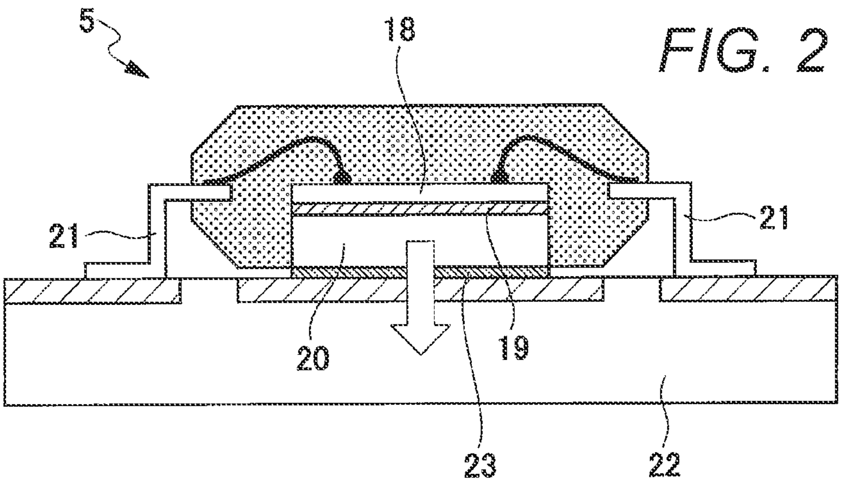
FIG. 2 is a sectional view illustrating an example of a package structure of the semiconductor switch according to the first embodiment of the present invention.
Figure 3:
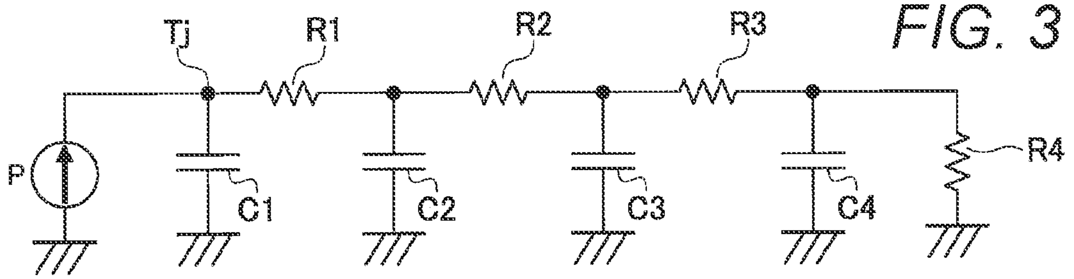
FIG. 3 is a view illustrating an example of an equivalent heat circuit network when a semiconductor substrate is used as a heat source in the package structure of the semiconductor switch according to the first embodiment of the present invention.

With reference to FIGS. 2 and 3, a method by which the temperature estimation unit 11 of the first embodiment estimates the internal temperature of the semiconductor switch 5 will be described below. In the first embodiment, an example of a method for modeling and estimating a heat radiation characteristic according to a package structure and a mounting structure of the semiconductor switch 5 by an equivalent thermal network will be described.

FIG. 2 is a sectional view illustrating an example of the package structure of the semiconductor switch 5.

The semiconductor switch 5 includes a semiconductor substrate 18 on which the power semiconductor 6 is formed using a semiconductor process. The semiconductor substrate 18 is bonded to a die pad 20 by a die attach 19.

For example, solder or the like is used as a material of the die attach 19. As the material of the die attach 19, an adhesive film made of resin or the like can also be used in addition to the solder.

For example, a frame containing copper as a main component can be used as the die pad 20. The power semiconductor 6 formed on the semiconductor substrate 18 is connected to a terminal 21 by a bonding wire. These constituent members are resin-molded by injection molding.

The terminal 21 is electrically connected to a circuit formed on a printed circuit board 22 by soldering or the like.

A microcomputer (not illustrated) or the like is also mounted on the printed circuit board 22. The die pad 20 is bonded to a conductor pattern of the printed circuit board 22 by solder 23 or the like. The heat generated in the semiconductor substrate 18 is dissipated to the printed circuit board 22 through the die pad 20 along a heat radiation path indicated by a white arrow in the drawing.

FIG. 3 is a view illustrating an example of an equivalent heat circuit network when the semiconductor substrate 18 is used as a heat source in the package structure of the semiconductor switch 5 in FIG. 2.

In FIG. 3, "P" represents a calorific value of the semiconductor substrate 18. The calorific value of the semiconductor substrate 18 is obtained from the power consumption calculated based on the current detected by the shunt resistor 10 and the voltage across the semiconductor switch 5.

In FIG. 3, "R1" and "C1" represent the thermal resistance and the heat capacity of the semiconductor substrate 18, "R2" and "C2" represent the thermal resistance and the heat capacity of the die attach 19, "R3" and "C3" represent the thermal resistance and the heat capacity of the die pad 20, and "R4" and "C4" represent the thermal resistance and the heat capacity of the solder 23 and the printed circuit board 22.

A ground symbol in FIG. 3 represents the ambient temperature of the semiconductor switch 5, and information detected by the temperature sensor 14 can be used as the ambient temperature. The thermal resistance and the heat capacity in FIG. 3 can be extracted by measuring thermal impedance of the semiconductor switch 5.

The temperature to be estimated by the temperature estimation unit 11 is a temperature Tj of the semiconductor substrate 18 in FIG. 2. Thus, the temperature estimation unit 11 can estimate the temperature Tj from the power consumption by calculating the temperature Tj based on the equivalent thermal network in FIG. 3. In the first embodiment, a technique for obtaining Tj by the calculation has been described. Alternatively, a method for producing map data indicating a relationship between the power consumption and the temperature using the calculation result in the equivalent thermal network and searching for the temperature according to the power consumption may be used.

An advantage of the estimation technique of the temperature Tj of the first embodiment is that the internal temperature of the semiconductor switch 5 can be estimated with high response and estimated following a rapid rise of the internal temperature. In addition, because the temperature estimation unit 11 estimates the temperature at the same position as the actual temperature information obtained from the temperature detection element 8 formed on the semiconductor substrate 18, the estimated temperature is easily compared with the actual temperature information.

Figure 4:
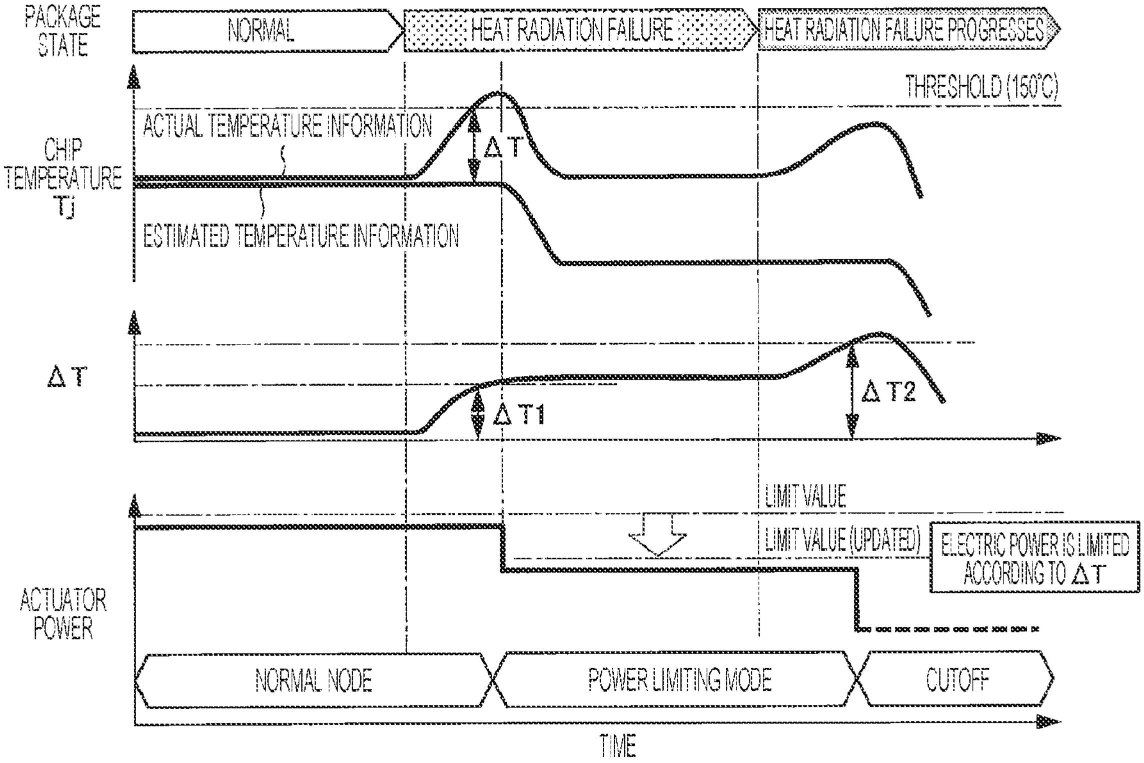
FIG. 4 is a view illustrating a transition of a package state of the semiconductor switch according to the first embodiment of the present invention and a relationship between a chip temperature and actuator power for each package state.

With reference to FIG. 4, an embodiment of the method for determining whether the semiconductor switch 5 is normal or abnormal in the determination unit 12 and power management of the actuator will be described below. In the following description, the actuator is an example of the load device 2 in FIG. 1.

<Power Control According to Package State>

FIG. 4 is a view illustrating transition of a package state of the semiconductor switch 5 and a relationship between a chip temperature and actuator power for each package state. In FIG. 4, the package state of the semiconductor switch 5 changes from a normal state to the heat radiation failure state in which the package is degraded, an adhesion state with the printed circuit board 22 is degraded, and the heat radiation failure is generated, and further the heat radiation failure progresses in this order. A state of the control of the first embodiment in each package state is illustrated.

The degradation state of the package is a state in which good thermal conduction in the semiconductor switch 5 is impaired by repeated application of thermal shock to the semiconductor switch 5. For example, when a crack is generated in the solder used for the die attach 19 or the solder 23 that is an adhesive material between the die pad 20 and the printed circuit board 22 in the sectional structure of the semiconductor switch 5 in FIG. 2, the package state is degraded and becomes abnormal.

(Normal State)

In FIG. 4, when the package state is normal, the drive management unit 13 drives the semiconductor switch 5 in the normal mode. Then, the chip temperature Tj indicated by the actual temperature information obtained from the temperature detection element 8 formed on the semiconductor substrate 18 inside the semiconductor switch 5 is matched with the chip temperature Tj indicated by the estimated temperature information obtained by the temperature estimation unit 11. In the following description, the chip temperature Tj indicated by the actual temperature information is abbreviated as "actual temperature information", and the chip temperature Tj indicated by the estimated temperature information is abbreviated as "estimated temperature information". In addition, even when the actual temperature information and the estimated temperature information when the package state is normal are not completely match with each other, it can be determined that the package state is normal when the difference between the pieces of information falls within a certain range. When the package state of the semiconductor switch 5 is normal, the electric power supplied to the actuator is controlled to be less than or equal to a specified limit value such that an IPD estimated temperature is less than the overtemperature threshold (for example, 150° C.).

(Heat Radiation Failure)

When the heat radiation failure is generated in the package, heat is likely to be accumulated in the semiconductor switch 5, so that the actual temperature information rises. On the other hand, the estimated temperature information is estimated based on the radiation structure when the semiconductor package is in the normal state. For this reason, when the power consumption of the semiconductor switch 5 is the same, the estimated temperature information does not change even when the package is degraded.

However, as illustrated in FIG. 4, a temperature difference ΔT is generated between the actual temperature information and the estimated temperature information. Thus, the determination unit (determination unit 12) compares the temperature difference added to the estimated temperature with the overtemperature threshold, and determines the state of the operation control unit (semiconductor switch 5) as either the normal state or the heat radiation failure state (also referred to as "abnormal"). When the determination unit 12 determines the state of the semiconductor switch 5 as either the normal state or the heat radiation failure state, the drive management unit 13 can easily manage the drive of the semiconductor switch 5. Then, when the temperature difference ΔT increases up to a first threshold ΔT1, the determination unit 12 determines that the package state is a package state in which the heat radiation failure is generated.

When the state of the operation control unit (semiconductor switch 5) is determined to be the heat radiation failure state, the management unit (drive management unit 13) limits the electric power supplied to the control target (load device 2) by the operation control unit (semiconductor switch 5) more than the electric power supplied in the normal state. For example, the drive management unit 13 receiving the determination result of the heat radiation failure state from the determination unit 12 switches to a power limiting mode limiting the operation of the actuator. When the drive management unit 13 outputs the on and off instructions to the gate drive circuit 7 while switching to the power limiting mode, the electric power supplied to the load device 2 through the semiconductor switch 5 is limited. The limit value of the electric power supplied to the actuator when the package state is the heat radiation failure is updated to a value lower than the limit value when the package state is normal. For this reason, even in the heat radiation failure, the actual temperature information returns to the value assumed when the package state is normal.

(Progression of Heat Radiation Failure)

Even when the operation of the semiconductor switch 5 is controlled in the state of the power limiting mode, the heat radiation performance of the semiconductor switch 5 is degraded, and the package state is further degraded when the heat radiation failure progresses. Then, the actual temperature information starts to rise again. When the temperature difference ΔT generated between the actual temperature information and the estimated temperature information increases up to a second threshold ΔT2 greater than the first threshold ΔT1, the determination unit 12 determines that the package state is a package state in which the heat radiation failure progresses.

When the determination unit 12 determines that the heat radiation failure further progresses, the management unit (drive management unit 13) stops the electric power supplied from the operation control unit (semiconductor switch 5) to the control target (load device 2). For example, the drive management unit 13 receiving the determination result that the heat radiation failure progresses from the determination unit 12 stops the operation of the actuator. For this reason, the drive management unit 13 outputs the off instruction to the gate drive circuit 7, and the semiconductor switch 5 cuts off the supply of the electric power. Then, the actuator in which the electrode supply is cut off is stopped. As described above, with the progress of the heat radiation failure, the drive management unit 13 can avoid an unintended stop of the load device 2 due to a sudden stop of the semiconductor switch 5 by gradually limiting the electric power supplied from the semiconductor switch 5 to the load device 2.

With the configuration of the controller 30 described above, the determination unit 12 can quantitatively determine the degradation state of the package of the semiconductor switch 5 based on the temperature difference obtained from the actual temperature information and the estimated temperature information. Then, the drive management unit 13 can output the instruction corresponding to the degradation state to the semiconductor switch 5. For this reason, when limiting the electric power supplied to the load device 2, the semiconductor switch 5 can avoid the sudden cutoff of the power supply due to the temperature rise of the semiconductor switch 5.

Furthermore, because the determination unit 12 can quantitatively detect the degradation state of the package, the drive management unit 13 can quantify the power amount to be limited based on the difference between the estimated temperature information and the actual temperature information, and continue the operation of the load device 2 while minimizing the power limiting amount. For example, quantification means that the drive management unit 13 determines the amount of power to be limited by the semiconductor switch 5 according to the temperature difference obtained from the estimated temperature information and the actual temperature information.

In addition, the drive management unit 13 delays the progress of the degradation of the package by limiting the operation of the actuator based on the degradation state of the package, thereby being able to maintain the function of the semiconductor switch 5 for a long period of time.

In addition, because maintenance is conventionally performed after the breakdown of the semiconductor switch 5, the load device 2 is required to stop. On the other hand, by the control of the first embodiment, the drive management unit 13 keeps the power limiting amount to the minimum necessary and continues the operation of the load device 2. Then, the drive management unit 13 can notify a user or a maintenance company of the degradation state or a degradation position of the package before the semiconductor switch 5 completely fails or stops the operation. For this reason, before the semiconductor switch 5 completely fails to cut off the power supply, the maintenance of the controller 30 including the semiconductor switch 5 can be performed when the heat radiation failure is first notified.

<Temperature Change of Semiconductor Switch>

The state of the temperature change of the semiconductor switch 5 during generation of the failure in the package will be described below focusing on the components of the package of the semiconductor switch 5 in FIG. 2.

Figure 5A:
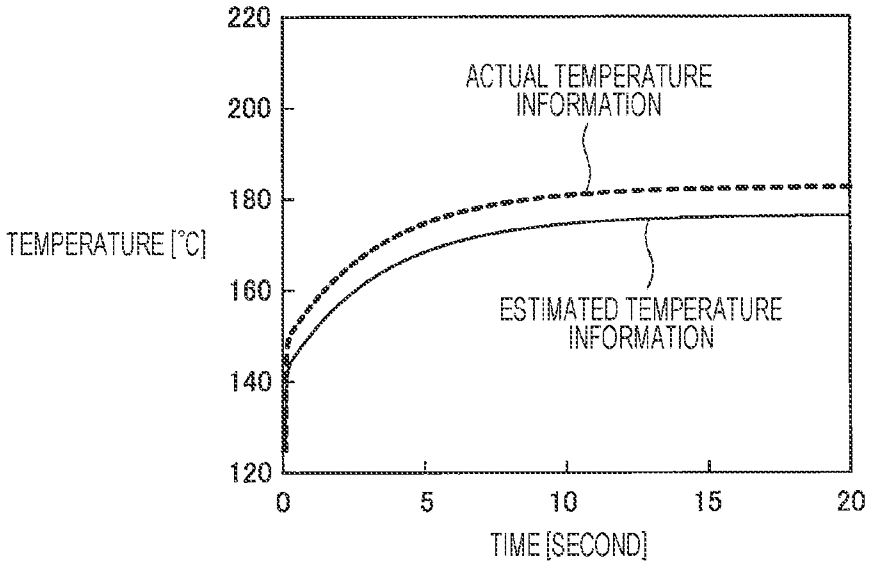
FIG. 5A is a view illustrating an example of actual temperature information and estimated temperature information when a crack is generated in die attach of the semiconductor switch according to the first embodiment of the present invention.
Figure 5B:
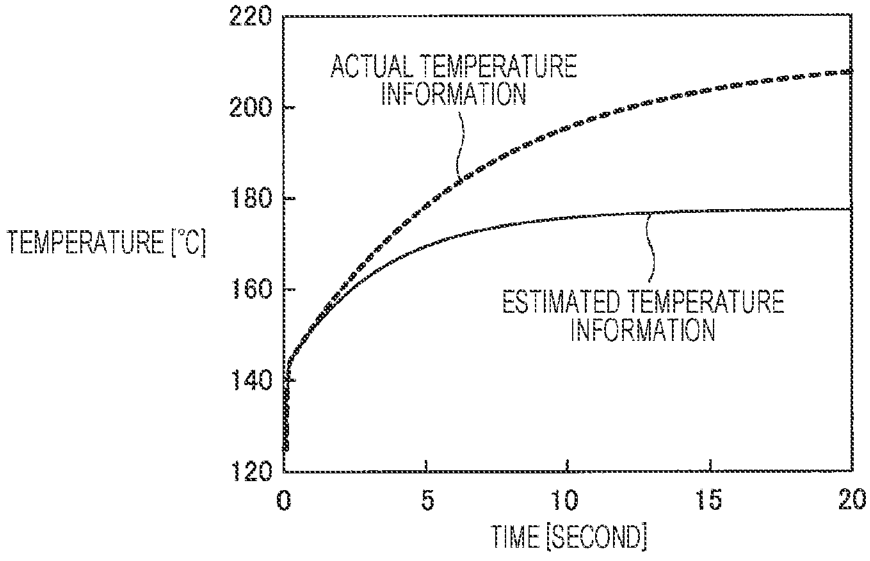
FIG. 5B is a view illustrating an example of the actual temperature information and the estimated temperature information when the crack is generated in solder of the semiconductor switch according to the first embodiment of the present invention.

FIGS. 5A and 5B are views illustrating examples of the actual temperature information and the estimated temperature information when the failure is generated in the die attach 19 or the solder 23 of the semiconductor switch 5. In FIGS. 5A and 5B, a horizontal axis represents time [sec], and a vertical axis represents temperature [° C.]. In addition, a broken line graph in FIGS. 5A and 5B represents the actual temperature information, and a solid line graph represents the estimated temperature information.

FIG. 5A illustrates an example of a temperature change when the crack is generated in the die attach 19.

When the crack is generated in the die attach 19, the thermal resistance increases even immediately after energization. For this reason, the temperature difference is generated between the actual temperature information and the estimated temperature information at the beginning of the energization. That is, the temperature difference is generated even when the die attach 19 is heated for a short time.

FIG. 5B illustrates an example of the temperature change when the solder 23 is cracked and the adhesion state with the printed circuit board 22 is degraded. A distance from the semiconductor substrate 18 as a heat source to the solder 23 is longer than a distance from the semiconductor substrate 18 to the die attach 19, so that the heat is transferred to the solder 23 after the heat capacity of each constituent member of the package is filled with the heat. For this reason, although the actual temperature information is matched with the estimated temperature information immediately after the energization, the difference between the actual temperature information and the estimated temperature information gradually increases.

Figure 6A:
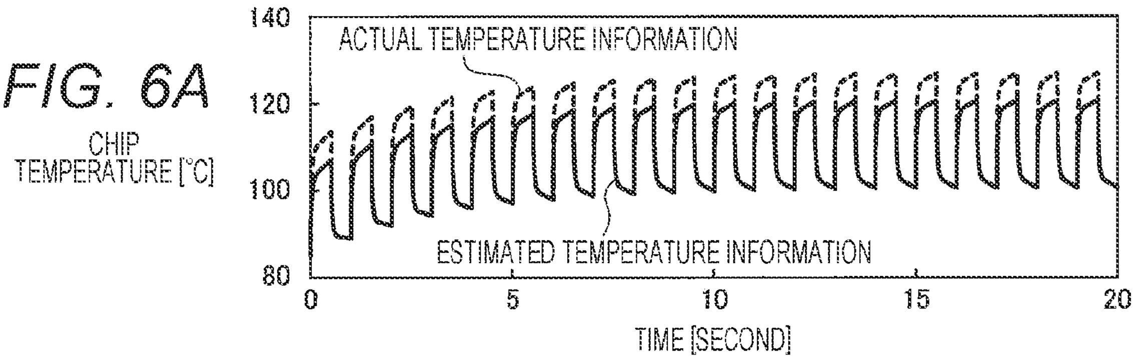
FIG. 6A is a view illustrating another example of the actual temperature information and the estimated temperature information when the crack is generated in the die attach of the semiconductor switch according to the first embodiment of the present invention.
Figure 6B:
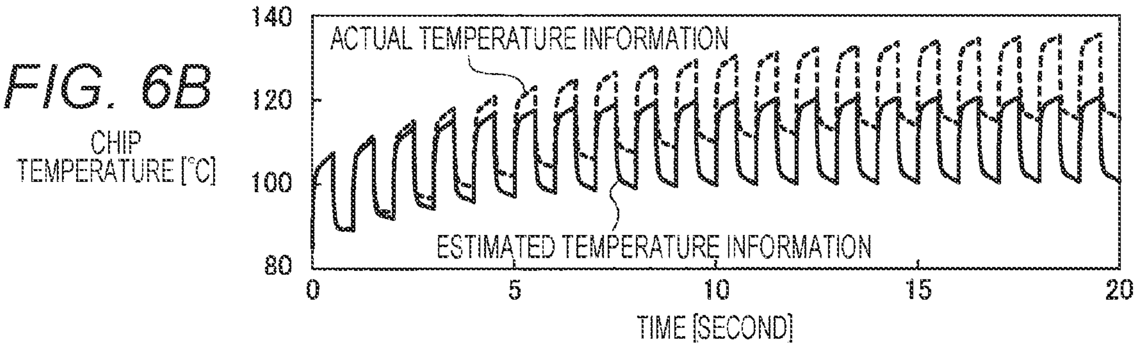
FIG. 6B is a view illustrating another example of the actual temperature information and the estimated temperature information when the crack is generated in the solder of the semiconductor switch according to the first embodiment of the present invention.

FIGS. 6A and 6B are views illustrating another example (chip temperature) of the actual temperature information and the estimated temperature information when the adhesion failure is generated between the die attach 19 and the printed circuit board 22 in the semiconductor switch 5. In FIGS. 6A and 6B, the horizontal axis represents time [sec], and the vertical axis represents a chip temperature [° C.]. FIGS. 6A and 6B illustrate transition of the chip temperature when the load device 2 that repeats the on and off operations is connected to the semiconductor switch 5.

FIG. 6A illustrates an example of the temperature when the crack is generated in the die attach 19. When the crack is generated in the die attach 19, the temperature difference is generated between the actual temperature information and the estimated temperature information even in the one-time on operation. On the other hand, in the off operation, the temperature difference between the actual temperature information and the estimated temperature information becomes small.

That is, the determination unit 12 can detect the heat radiation failure due to the failure of the die attach 19 by detecting the temperature difference during the on operation period.

FIG. 6B illustrates n example of the temperature transition when the crack is generated in the solder 23 to degrade the adhesion state with the printed circuit board 22. When the crack is generated in the solder 23, the difference between the actual temperature information and the estimated temperature information gradually increases after the energization. Then, the temperature difference is generated in both the on period and the off period. For this reason, after a lapse of a certain period of time after the energization (for example, 5 seconds), the determination unit 12 detects the temperature difference in both the on period and the off period, whereby the heat radiation failure due to the failure of the solder 23 can be detected.

As described above, there are the timing at which the temperature difference is generated and the timing at which the temperature difference is not generated depending on a failure portion generated in the semiconductor switch 5. Thus, when the determination unit 12 detects the temperature difference during the on period of the semiconductor switch 5, the heat radiation failure can be detected for any defect. In addition, the determination unit 12 can specify a breakdown portion depending on whether the temperature difference is generated in both the on period and the off period. Thus, the determination unit (determination unit 12) determines the constituent member in which the abnormality his generated based on the change in the temperature difference for each constituent member of the semiconductor switch (semiconductor switch 5) after the energization of the semiconductor switch (semiconductor switch 5) is started. The constituent member in which the abnormality is generated is determined as described above, so that the cause of the heat radiation failure can be easily identified when the semiconductor switch 5 generates the heat radiation failure.

The controller 30 of the first embodiment quantitatively detects the defect in the heat radiation path of the semiconductor switch 5 due to peeling inside the package of the semiconductor switch 5 or the degradation of a board mounting member such as heat radiation grease or solder. Then, the drive management unit 13 limits the electric power supplied from the semiconductor switch 5 to the load device 2 before the semiconductor switch 5 completely fails, so that the sudden cutoff of the function of the semiconductor switch 5 can be avoided and maintain the function of the load device 2 as much as possible according to a degree of the abnormal state.

<Effect of Constituting Shunt Resistor>

At this point, in the controller 30 of the first embodiment, the shunt resistor 10 is provided between the battery 4 and the semiconductor switch 5. Accordingly, the temperature estimation unit 11 can constantly detect the total current of the current flowing through the semiconductor switch 5 without depending on the on or off state of the semiconductor switch 5. In addition, the temperature estimation unit 11 can constantly detect the total current, so that accuracy of the temperature estimation of the semiconductor switch 5 can be improved.

In addition, even when a short-circuit breakdown is generated in the internal circuit of the semiconductor switch 5, the shunt resistor 10 is provided between the battery 4 and the semiconductor switch 5, so that the temperature estimation unit 11 can detect a current abnormality in the semiconductor switch 5.

<Another Form of Current Detection Function>

Figure 7:
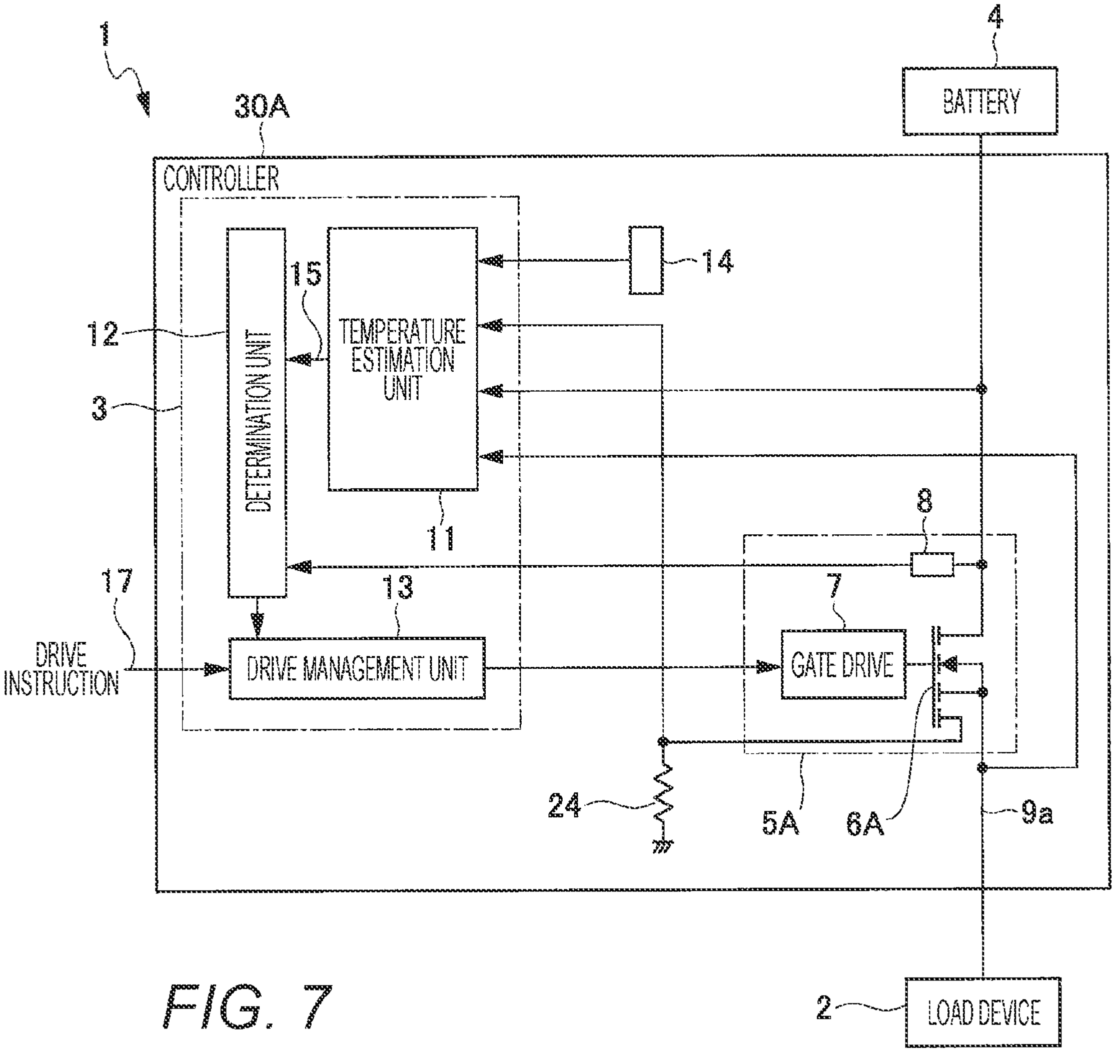
FIG. 7 is a schematic configuration diagram illustrating a controller including a semiconductor switch having a current detection function according to the first embodiment of the present invention.

In the first embodiment, the shunt resistor 10 is used as a preferable configuration to detect the current flowing through the semiconductor switch 5, but the present invention is not limited thereto. With reference to FIG. 7, another embodiment of the controller 30 having a current detection function will be described below.

<Semiconductor Switch Having Current Detection Function>

FIG. 7 is a schematic configuration diagram illustrating a controller 30A including a semiconductor switch 5A having the current detection function.

The power supply system 1 in FIG. 7 has a configuration in which the controller 30 included in the power supply system 1 in FIG. 1 is replaced with the controller 30A.

The controller 30A is configured to remove the shunt resistor 10 from the controller 30 in FIG. 1 and replace the semiconductor switch 5 with the semiconductor switch 5A. The semiconductor switch 5A includes a current sense MOS FET 6A, the gate drive circuit 7, and the temperature detection element 8. As described above, the semiconductor switch (semiconductor switch 5A) includes the current sense MOSFET (current sense MOSFET 6A) that detects the current supplied to the semiconductor switch (semiconductor switch 5A) as a current detection unit. The semiconductor switch 5A itself detects the current, so that the controller 30A can be configured to exclude the shunt resistor 10.

As described above, the current sense MOS FET 6A is obtained by replacing the power semiconductor 6 of the semiconductor switch 5 in FIG. 1, and has the current detection function. The current sense MOS FET 6A detects the current by configuring a mirror circuit with a MOS FET that allows a large current to flow and a MOS FET that is well matched with the MOS FET. The current of the mirror circuit flows to a resistor 24, and the voltage is applied to the resistor 24. An amplifier circuit, an A/D conversion circuit, and the like (not illustrated) are provided in a path from the resistor 24 toward the temperature estimation unit 11. The temperature estimation unit 11 can detect the current flowing through the semiconductor switch 5A by detecting the voltage applied to the resistor 24.

<Controller Having Actual Temperature Information Detection Function>

In the first embodiment, the temperature detection element 8 is provided inside the semiconductor switch 5 to detect the actual temperature information. However, the present invention is not limited thereto. According to another embodiment, the actual temperature information can also be detected.

Figure 8:
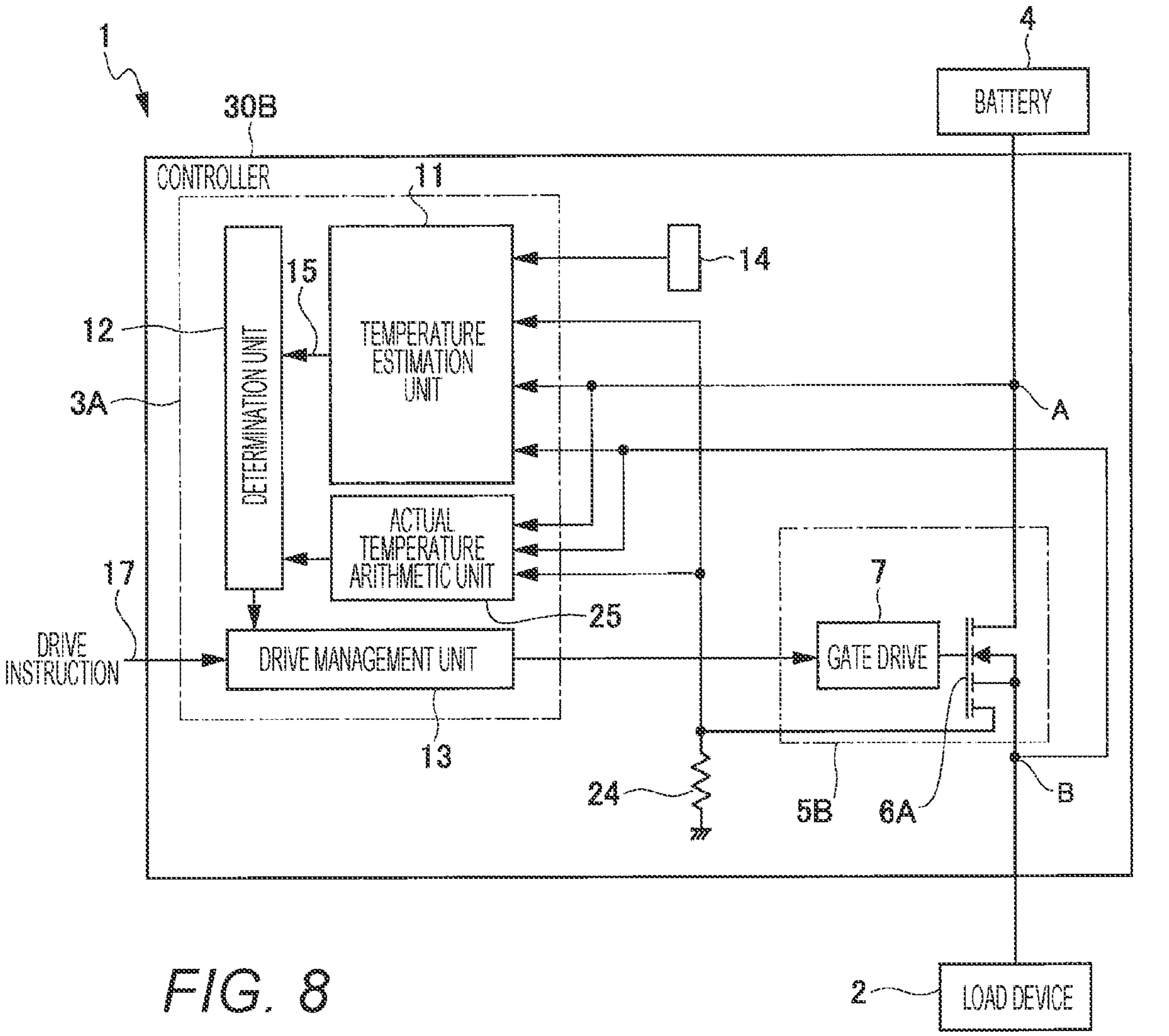
FIG. 8 is a schematic configuration diagram illustrating a controller including a semiconductor switch having an actual information detection function according to the first embodiment of the present invention.

FIG. 8 is a schematic configuration diagram illustrating a controller 30B including a semiconductor switch 5B having the actual temperature information detection function.

The power supply system 1 in FIG. 8 has a configuration in which the controller 30 included in the power supply system 1 in FIG. 1 is replaced with the controller 30B.

The controller 30B includes a control unit 3A and the semiconductor switch 5B in FIG. 8. A semiconductor switch (semiconductor switch 5B) includes a current sense MOS FET (current sense MOSFET 6A) that detects the current supplied to a semiconductor switch (semiconductor switch 5B) as a current detection unit. The semiconductor switch 5B itself detects the current, so that the controller 30B can be configured to exclude the shunt resistor 10.

The control unit 3A has a configuration in which an actual temperature arithmetic unit 25 is added to the control unit 3 in FIG. 1.

In addition, the semiconductor switch 5B has a configuration in which the temperature detection element 8 is removed from the semiconductor switch 5A in FIG. 7.

An actual temperature detection unit (actual temperature arithmetic unit 25) outputs the actual temperature information about the actual temperature operated based on the change in an on-resistance of a current sense MOSFET (current sense MOS FET 6A) to the determination unit (determination unit 12). The control unit 3A itself can detect the actual temperature, so that the controller 30B can have the configuration excluding the temperature detection element 8. For example, the actual temperature arithmetic unit 25 has a function for detecting the actual temperature information using the temperature dependency of the on-resistance of the current sense MOS FET 6A included in the semiconductor switch 5B. The on-resistance is a resistance between the source and the drain during the energization of the current sense MOS FET 6A, and can be calculated from the voltage between the source and the drain and the current according to Ohm's law. When the temperature of the current sense MOS FET 6A increases, the resistance value between the source and the drain increases. Then, the voltage (point A and point B voltages) across the semiconductor switch 5B is input to the actual temperature arithmetic unit 25 as a source-drain voltage.

In addition, the actual temperature arithmetic unit 25 detects the source-drain current using the current sense MOS FET 6A in the semiconductor switch 5B and further using the voltage of the resistor 24 that detects the current of the current sense MOS FET 6A. Then, the actual temperature arithmetic unit 25 calculates the resistance value of the on-resistance of the current sense MOS FET 6A based on the detected source-drain voltage and the source-drain current, and calculates the temperature from the relationship between the temperature and the resistance value.

In the first embodiment, the embodiments of the current detection element and the temperature detection element have been described, but the controller and the semiconductor switch may be configured to appropriately combine these elements and detection methods. In addition, in the current detection and the voltage detection, an amplifier may be appropriately used.

Second Embodiment

A configuration example of a power supply system according to a second embodiment to which the present invention is applied will be described below. The configuration example of a controller 30C including a semiconductor switch 5C having no function for outputting the actual temperature information will be described in the second embodiment.

Figure 9:
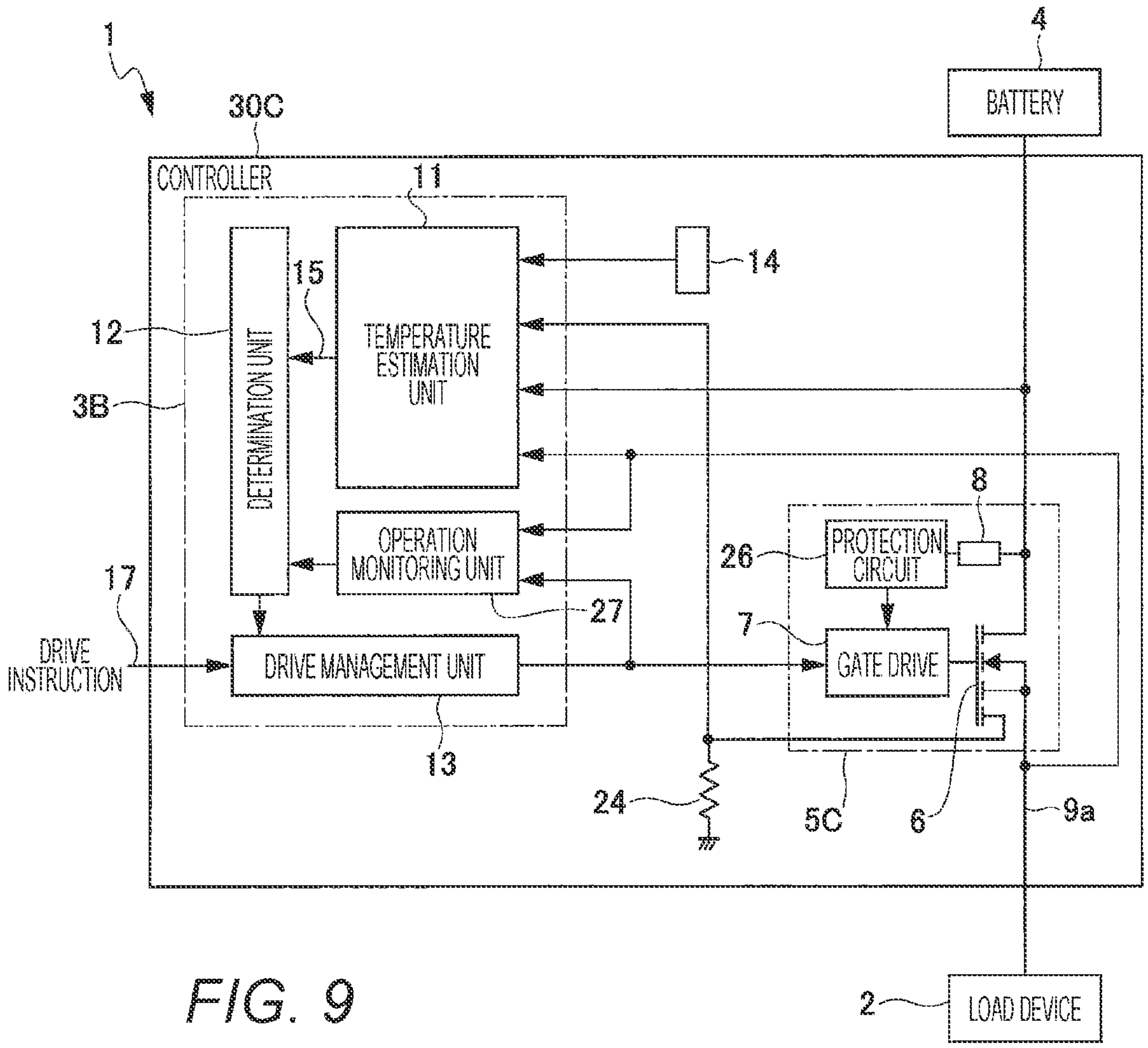
FIG. 9 is a schematic configuration diagram illustrating a controller including a semiconductor switch not having a function for outputting actual temperature information according to a second embodiment of the present invention.

FIG. 9 is a schematic configuration diagram illustrating the controller 30C including the semiconductor switch 5C not having the function for outputting the actual temperature information. The semiconductor switch 5C includes a protection circuit 26 that protects the semiconductor switch 5C itself, and the temperature detection element 8 outputs the actual temperature information to the protection circuit 26.

The power supply system 1 in FIG. 9 has a configuration in which the controller 30 included in the power supply system 1 in FIG. 1 is replaced with the controller 30C.

The controller 30C includes a control unit 3B and the semiconductor switch 5C.

The semiconductor switch 5C performs the on and off control of the electric power from the battery 4 and controls the power supply to the load device 2. The semiconductor switch 5C includes the power semiconductor 6, the gate drive circuit 7, the temperature detection element 8, and the protection circuit 26. That is, the semiconductor switch 5C has a configuration in which the protection circuit 26 is added to the semiconductor switch 5 in FIG. 1. As described above, a semiconductor switch (semiconductor switch 5C) includes an overtemperature protection unit (protection circuit 26) that cuts off a semiconductor switch (semiconductor switch 5C) when the actual temperature detected by the actual temperature detection unit (temperature detection element 8) reaches the overtemperature threshold. By providing the protection circuit 26 in the semiconductor switch 5C, the electric power supplied from the semiconductor switch 5C to the load device 2 is immediately cut off when the actual temperature reaches the overtemperature threshold, and the operation of the load device 2 can be temporarily stopped. Thereafter, the operation of the load device 2 can be safely restarted while the electric power supplied to the load device 2 is limited by the drive management unit 13.

As described above, the gate drive circuit 7 outputs on and off voltages (or currents) to the gate terminal of the power semiconductor 6.

The temperature detection element 8 detects the actual temperature of the power semiconductor 6. The temperature detection element 8 does not output the actual temperature information to the determination unit 12, but outputs the actual temperature information to the protection circuit 26.

The protection circuit 26 sends a signal to the gate drive circuit 7 based on the temperature of the temperature detection element 8 to cut off the power semiconductor 6.

A power input terminal of the semiconductor switch 5C is connected to the battery 4. The power line 9*a* is connected to the output terminal of the semiconductor switch 5C. The power line 9*a* is connected to the power input terminal of the load device 2.

The control unit 3B has a configuration in which an operation monitoring unit 27 is added to the control unit 3 in FIG. 1.

The temperature estimation unit 11 detects the power consumption of the semiconductor switch 5C based on the current of the semiconductor switch 5C detected based on the voltage of the resistor 24 and the voltage across the semiconductor switch 5C. Based on the detected power consumption, the temperature estimation unit 11 outputs the estimated temperature information 15 obtained by the arithmetic operation of the internal temperature of the semiconductor switch 5C to the determination unit 12.

The ambient temperature detected by the temperature sensor 14 detecting the ambient temperature of the semiconductor switch 5 is used in the arithmetic operation of the estimated temperature information 15. The method by which the temperature estimation unit 11 estimates the internal temperature of the semiconductor switch 5 is similar to that of the first embodiment.

An operation monitoring unit (operation monitoring unit 27) monitors the operation in which the overtemperature protection unit (protection circuit 26) cuts off the semiconductor switch (semiconductor switch 5C), and outputs a cutoff operation detection result to the determination unit (determination unit 12) when the cutoff operation of the semiconductor switch (semiconductor switch 5C) is performed. For example, the operation monitoring unit 27 has a function for monitoring the on and off instructions transmitted from the drive management unit 13 of the control unit 3B to the semiconductor switch 5C and an output terminal voltage of the semiconductor switch 5C to monitor whether the protection circuit 26 operates. Then, the operation monitoring unit 27 outputs a monitoring result of the operation of the protection circuit 26 to the determination unit 12.

The determination unit (determination unit 12) determines the heat radiation failure state of the semiconductor switch (semiconductor switch 5C) based on the cutoff operation detection result input from the operation monitoring unit (operation monitoring unit 27). At this point, the determination unit 12 can determine whether the semiconductor switch 5C is normal or abnormal based on the estimated temperature information 15 and the monitoring result of the operation monitoring unit 27. Because the controller 30C includes the operation monitoring unit 27 as described above, the generation of the heat radiation failure can be indirectly determined in the semiconductor switch 5C based on the cutoff operation of the protection circuit 26. Details of a method for determining whether the semiconductor switch 5C is normal or abnormal will be described later.

The drive management unit 13 outputs the on and off instructions of the semiconductor switch 5C according to the drive instruction 17. The on and off instructions are input to the gate drive circuit 7 of the semiconductor switch 5C, and controls the drive of the load device 2 through the power semiconductor 6. The method by which the drive management unit 13 receives the abnormality determination from the determination unit 12 to limit the drive of the load device 2 (the output of the off instruction, a method for lowering a carrier frequency in the PWM waveform, and correction of the drive instruction 17) and the effect are similar to those of the drive management unit 13 of the first embodiment.

An embodiment of a method for determining whether the semiconductor switch 5C is normal or abnormal in the determination unit 12 in FIG. 9 and the power management of the actuator will be described below.

<Power Control According to Package State>

Figure 10:
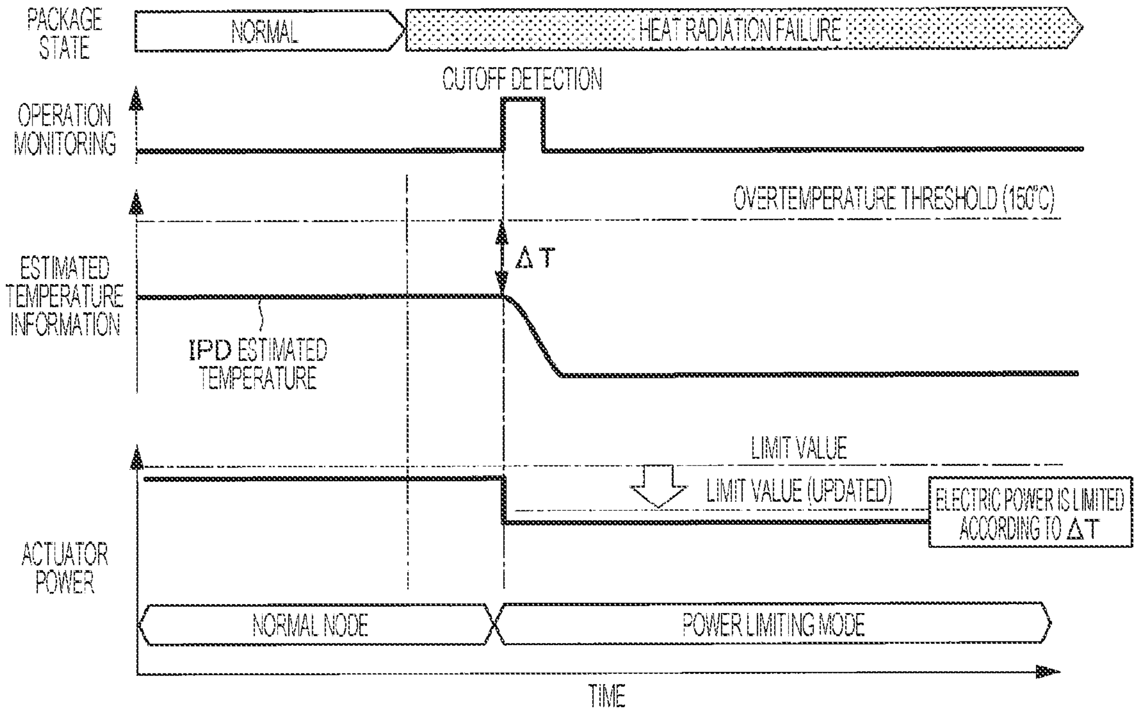
FIG. 10 is a view illustrating transition of a package state of the semiconductor switch according to the second embodiment of the present invention and a relationship among an operation monitoring state, estimated temperature information, and actuator power for each package state.

FIG. 10 is a view illustrating the transition of the package state of the semiconductor switch 5C and a relationship among the operation monitoring state, the estimated temperature information, and the actuator power for each package state. In FIG. 10, the package state of the semiconductor switch 5C in FIG. 9 changes from the normal state to the state in which the heat radiation failure is generated due to the degradation of the package or the degradation of the bonding state of the printed circuit board 22. FIG. 10 illustrates the state of control of the second embodiment in each package state.

(Normal State)

In FIG. 10, when the package state is normal, the drive management unit 13 drives the semiconductor switch 5 in the normal mode. When the package state is normal, the electric power supplied to the actuator is controlled to be less than or equal to the specified limit value such that the IPD estimated temperature is less than the overtemperature threshold (for example, 150° C.). The estimated temperature information obtained by the temperature estimation unit 11 is referred to as an IPD estimated temperature. In the normal state, the operation monitoring unit 27 does not detect the operation of the protection circuit 26.

(Heat Radiation Failure State)

The temperature of the semiconductor switch 5C increases when the degradation state of the package of the semiconductor switch 5C changes from the normal state to the heat radiation failure state. Then, at the timing when the actual temperature reaches the overtemperature threshold, the protection circuit 26 provided inside the semiconductor switch 5C operates to output the cutoff instruction to the gate drive circuit 7. When the protection circuit 26 operates, the operation monitoring unit 27 detects the cutoff operation of the protection circuit 26 based on the current change of the power line 9*a*. Then, the operation monitoring unit 27 outputs the detection result of the cutoff operation by the protection circuit 26 to the determination unit 12.

The determination unit 12 detects the temperature difference ΔT between the estimated temperature information estimated by the temperature estimation unit 11 and the overtemperature threshold at the timing detected by the operation monitoring unit 27. The overtemperature threshold is a temperature at which the protection circuit 26 provided in the semiconductor switch 5C operates, and the overtemperature threshold can be previously known as a design value. When the value obtained by adding the temperature difference ΔT to the IPD estimated temperature is greater than or equal to the overtemperature threshold, the drive management unit 13 switches to the power limiting mode in which the operation of the actuator is limited.

The drive management unit 13 outputs the on and off instructions to the gate drive circuit 7 in the power limiting mode. Accordingly, the electric power supplied to the load device 2 through the semiconductor switch 5C is limited. In addition, because the mode is changed to the power limiting mode to reduce the electric power supplied from the semiconductor switch 5B to the load device 2, the IPD estimated temperature is lower than that in the normal mode.

Although not illustrated, when the heat radiation failure state continues to further progress the heat radiation failure state of the package of the semiconductor switch 5C, the protection circuit 26 operates again, and the operation monitoring unit 27 detects the cutoff operation of the protection circuit 26. In this case, in order to determine that the heat radiation failure state of the package progresses by the determination unit 12, the drive management unit 13 instructs the semiconductor switch 5C to stop the operation. For this reason, the semiconductor switch 5C stops the power supply to the load device 2.

With the configuration of the controller 30C described above, when the actual temperature of the semiconductor switch 5C reaches the overtemperature threshold, the protection circuit 26 operates, and the gate drive circuit 7 limits the electric power supplied from the power semiconductor 6 to the load device 2 at the timing when the protection circuit 26 operates. The operation monitoring unit 27 detects that the electric power supplied from the power semiconductor 6 to the load device 2 is limited, and the determination unit 12 determines that the semiconductor switch 5C is not in the normal state. For this reason, the determination unit 12 can detect the degradation state of the package of the semiconductor switch 5C without directly acquiring the actual temperature information from the semiconductor switch 5C.

The drive management unit 13 can continue the operation of the semiconductor switch 5C by appropriately limiting the electric power to be supplied to the load device 2 according to the temperature difference ΔT between the estimated temperature information and the overtemperature threshold at a point of time when the protection circuit 26 operates. That is, in the second embodiment, the semiconductor switch 5C is cut off once due to the overtemperature and the function is stopped, but thereafter, the operation of the semiconductor switch 5C can be continued because the electric power is limited to the appropriate electric power. For this reason, it is possible to avoid that the temperature of the semiconductor switch 5C rises again to repeatedly stop the semiconductor switch 5C.

The operation monitoring unit 27 of the second embodiment compares the on and off signals input from the drive management unit 13 to the semiconductor switch 5C with the actual on and off states of the semiconductor switch 5C to detect whether the overtemperature protection function of the protection circuit 26 operates. At this point, the semiconductor switch 5C may have a function for outputting status information indicating that the overtemperature protection function of the protection circuit 26 operates to the determination unit 12 of the control unit 3B. The determination unit 12 can find that the semiconductor switch 5C is in the overtemperature state based on the status information input from the semiconductor switch 5C. Then, the drive management unit 13 can switch from the normal mode to the power limiting mode and continue the operation of the semiconductor switch 5C.

Third Embodiment

A configuration example of a power supply system according to a third embodiment of the present invention will be described below. The operation of the controller that controls the power supply to a plurality of load devices connected to one semiconductor switch will be described in the third embodiment.

Figure 11:
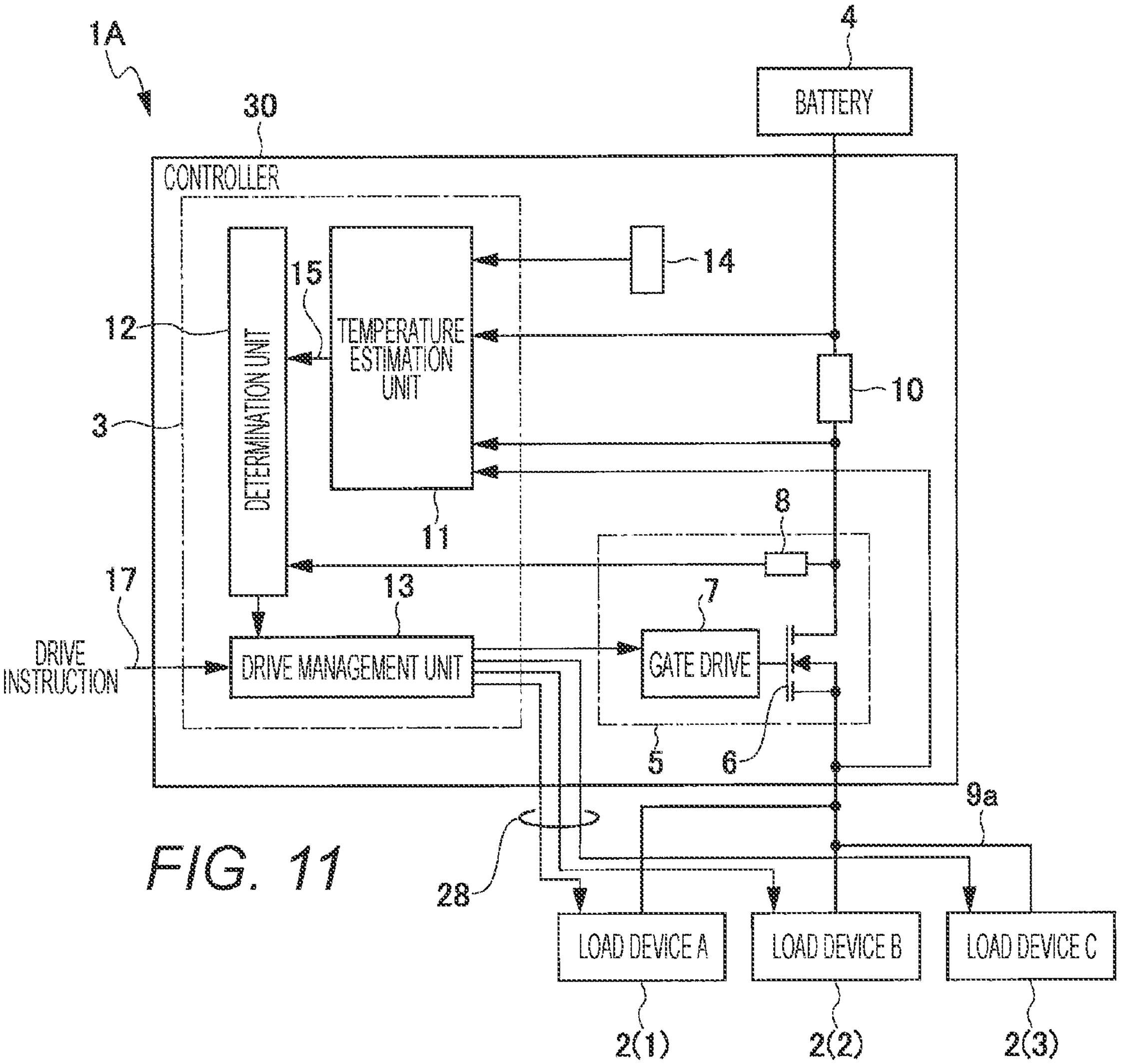
FIG. 11 is a view illustrating a configuration example of a controller in which a plurality of load devices are connected to a semiconductor switch according to a third embodiment of the present invention.

FIG. 11 is a view illustrating a configuration example of the controller 30 in which a plurality of load devices 2(1) to 2(3) are connected to the semiconductor switch 5.

A power supply system 1A includes the battery 4, the controller 30, and the load devices 2(1) to 2(3).

The configuration of the controller 30 is similar to that of the controller 30 of the first embodiment described above. The plurality of load devices 2(1) to 2(3) are connected to the controller 30. In FIG. 11, the load device 2(1) is described as a "load device A", the load device 2(2) is described as a "load device B", and the load device 2(3) is described as a "load device C". When the load devices 2(1) to 2(3) are not distinguished in the following description, they are referred to as the load device 2.

As described above, a plurality of control targets (load devices 2(1) to 2(3)) to which the electric power is supplied from the operation control unit (semiconductor switch 5) are connected to the management unit (drive management unit 13). The drive management unit 13 and the load devices 2(1) to 2(3) are connected by a communication line 28. Digital communication such as a controller area network (CAN) or a local interconnect network (LIN), analog transmission for transmitting a PWM signal, a voltage signal, or the like can be used as the communication line 28.

The electric power is supplied to the load devices 2(1) to 2(3) through the semiconductor switch 5. The load devices 2(1) to 2(3) receive the operation instructions for the load devices 2(1) to 2(3) transmitted from the drive management unit 13 through the communication line 28 and operate.

Similarly to the determination unit 12 of the first embodiment, the determination unit 12 of the controller 30 of the third embodiment determines the degradation state of the semiconductor switch 5 based on the actual temperature information and the estimated temperature information about the semiconductor switch 5. When the determination unit (determination unit 12) determines that the state of the operation control unit (semiconductor switch 5) changes, the management unit (drive management unit 13) stops the electric power supplied from the operation control unit (semiconductor switch 5) to the control target (load device 2) having a low priority among the plurality of control targets (load devices 2(1) to 2(3)). As described above, when it is determined that the semiconductor switch 5 is in the degradation state, the drive management unit 13 stops the operation of any one of the load devices 2(1) to 2(3) through the communication line 28. Preferably, priorities corresponding to importance levels of functions are set to the load devices 2(1) to 2(3), and the power supply to the load device 2 having the lower priority is stopped. Even when the load device 2 having the low priority stops, the load device 2 having the high priority operates, so that it is avoided that the operation of the important load device 2 immediately stops.

In the power supply system 1A of the third embodiment described above, the plurality of load devices 2(1) to 2(3) are connected to one semiconductor switch 5, and the drive management unit 13 controls the operation amount of the load device 2 through the communication line. When the abnormality is generated in the semiconductor switch 5, the determination unit 12 quantitatively detects the abnormal state of the semiconductor switch 5. At this point, in the power supply system 1A, the drive management unit 13 corrects the operation amount as the drive instruction 17 to a limited value, and transmits the corrected value to the load device 2 through the communication line. For this reason, the drive management unit 13 can directly switch the switch provided inside the load device 2 to on or off to control the operation of the load device 2.

As described above, in the power supply system 1A, even in the mode in which the plurality of load devices 2 are connected to the semiconductor switch 5, the power supply to the load device 2 in which the operation is turned off is stopped, so that the electric power supplied to the entire load device 2 is restrained. As a result, the current flowing through the semiconductor switch 5 is reduced, so that the breakdown or stop of the semiconductor switch 5 due to overtemperature can be prevented. In addition, the drive management unit 13 can perform the control while maintaining the operation of the load device 2 having the function having the high priority by continuing the power supply to the load device 2 having the high priority.

Fourth Embodiment

A configuration example of a power supply system according to a fourth embodiment of the present invention will be described below.

The operation of the controller that controls the power supply to the plurality of load devices 2 connected one-to-one to a plurality of semiconductor switches will be described in the fourth embodiment.

Figure 12:
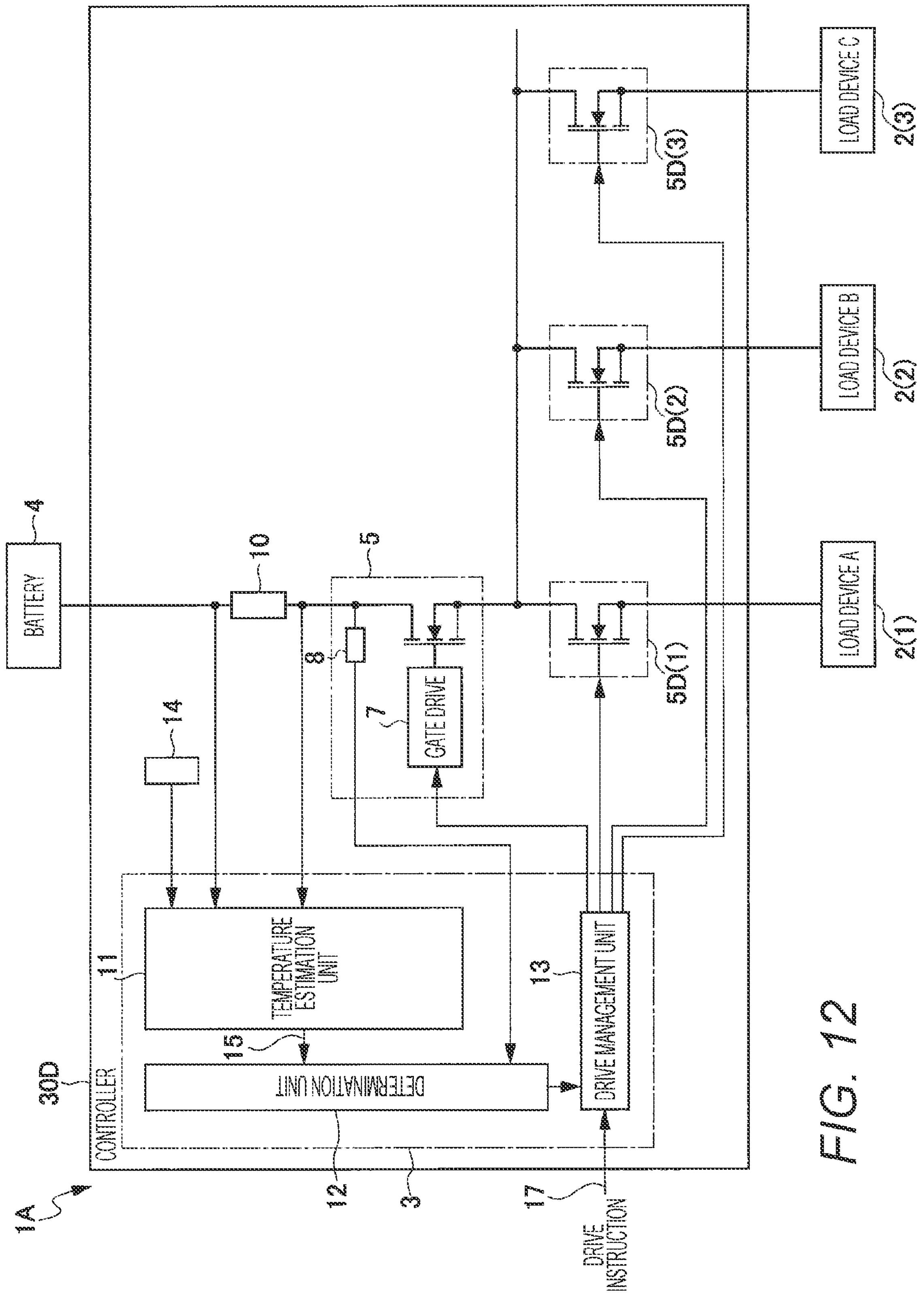
FIG. 12 is a view illustrating a configuration example of a controller in which a plurality of semiconductor switches are branched and connected downstream of a semiconductor switch according to a fourth embodiment of the present invention.

FIG. 12 is a view illustrating a configuration example of a controller 30D in which a plurality of semiconductor switches 5D are branched and connected downstream of a semiconductor switch 5.

The power supply system 1A has the same configuration as the power supply system 1A in FIG. 11, but the controller 30 is replaced with the controller 30D.

The controller 30D includes a plurality of semiconductor switches 5D(1) to 5D(3) in addition to each unit of the controller 30 of the first embodiment. The controller 30D includes a plurality of second operation control units (semiconductor switches 5D(1) to 5D(3)) that are provided for each of the plurality of control targets (load devices 2(1) to 2(3)) and supply the electric power supplied from the operation control unit (semiconductor switch 5) to the control targets (load devices 2(1) to 2(3)). When the semiconductor switches 5D (1) to 5D (3) are not distinguished in the following description, they are referred to as the semiconductor switch 5D.

The plurality of semiconductor switches 5D(1) to 5D (3) are branched and connected to the semiconductor switch 5. Then, the load devices 2(1) to 2(3) are connected to the plurality of semiconductor switches 5D(1) to 5D(3) on a one-to-one basis. The electric power is supplied to the load devices 2(1) to 2(3) through the connected semiconductor switches 5D(1) to 5D(3), respectively.

The on and off instructions are individually input from the drive management unit 13 to each gate of the semiconductor switches 5D(1) to 5D (3). The semiconductor switches 5D(1) to 5D (3) supply the electric power to the connected load devices 2(1) to 2(3) in response to the on and off instructions. The load devices 2(1) to 2(3) are driven and controlled by the connected semiconductor switches 5D(1) to 5D(3), respectively.

Similarly to the first embodiment, the determination unit 12 determines the degradation state of the semiconductor switch 5 based on the actual temperature information and the estimated temperature information about the semiconductor switch 5. When the operation control unit (semiconductor switch 5D) limits the electric power supplied to the control target (load device 2) based on the determination result, the management unit (drive management unit 13) stops the electric power supplied to the control target (load device 2) by the second operation control unit (one of semiconductor switches 5D) with respect to the second operation control unit (one of semiconductor switches 5D) connected to the control target (load device 2) having the low priority in the plurality of control targets (load devices 2). When it is determined that the semiconductor switch 5 is in the degradation state, the drive management unit 13 cuts off any one of the semiconductor switches 5D(1) to 5D(3) and stops the operation of any one of the load devices 2(1) to 2(3). Preferably, the drive management unit 13 sets priorities corresponding to the degrees of importance of functions for the load devices 2(1) to 2(3), and stops the load devices 2(1) to 2(3) in descending order of priority. Even when the load device 2 having the low priority stops, the load device 2 having the high priority operates, so that it is avoided that the operation of the important load device 2 immediately stops.

In the power supply system 1A of the fourth embodiment described above, the plurality of load devices 2(1) to 2(3) are connected to one semiconductor switch 5 through the semiconductor switches 5D(1) to 5D(3), respectively. Then, when the abnormality is generated in the semiconductor switch 5, the determination unit 12 quantitatively detects the abnormal state, so that the drive management unit 13 can perform the control while maintaining the function having the high priority. In particular, the determination unit 12 can detect the abnormal state of the semiconductor switch, in which a large current flows and the temperature environment is severe, in the plurality of semiconductor switches 5, 5D(1) to 5D(3) provided in the controller 30.

Fifth Embodiment

A configuration example of a power supply system according to a fifth embodiment of the present invention will be described below.

The operation of the controller that controls the power supply to the plurality of load devices connected one-to-one to the plurality of semiconductor switches will be described in the fifth embodiment.

Figure 13:
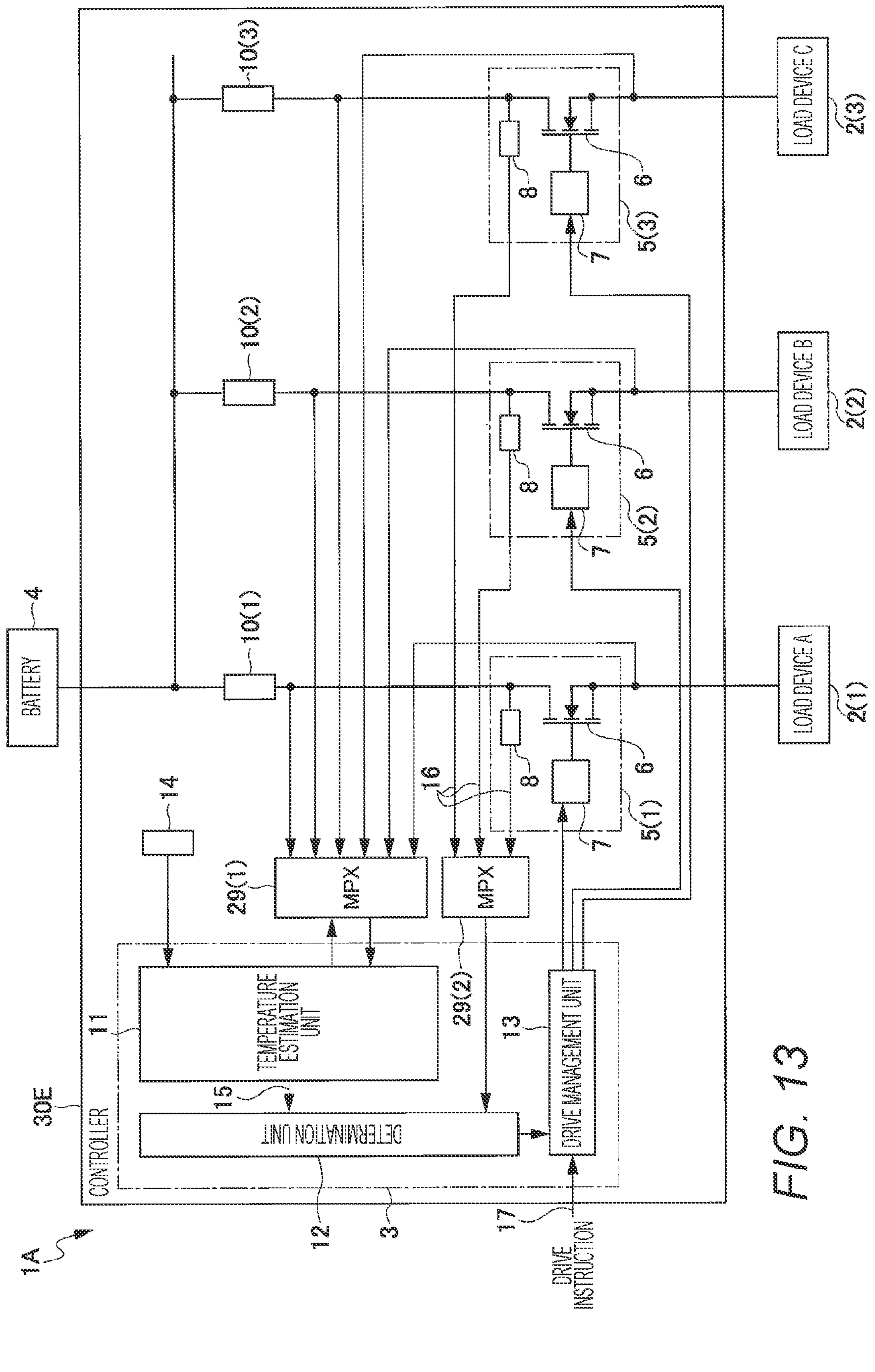
FIG. 13 is a view illustrating a configuration example of a controller including a plurality of semiconductor switches according to a fifth embodiment of the present invention.

FIG. 13 is a view illustrating a configuration example of a controller 30E including the plurality of semiconductor switches 5.

The power supply system 1A in FIG. 13 has the same configuration as the power supply system 1A in FIG. 11, but the controller 30 is replaced with the controller 30E.

The controller 30E includes the plurality of semiconductor switches 5(1) to 5(3), a plurality of shunt resistors 10(1) to 10(3), and a plurality of multiplexers 29(1), 29(2) in addition to the control unit 3 and the temperature sensor 14.

The plurality of shunt resistors 10(1) to 10(3) are connected between the battery 4 and the plurality of semiconductor switches 5(1) to 5(3), respectively. Then, the load devices 2(1) to 2(3) are connected to the plurality of semiconductor switches 5(1) to 5(3) on a one-to-one basis. The electric power is supplied to the load devices 2(1) to 2(3) through the connected semiconductor switches 5(1) to 5(3), respectively. When the semiconductor switches 5(1) to 5(3) are not distinguished in the following description, they are referred to as the semiconductor switch 5.

The plurality of control targets (load devices 2(1) to 2(3)) to which the electric power is supplied from a plurality of operation control units (semiconductor switches 5(1) to 5(3)) are connected to the management unit (drive management unit 13). The drive management unit 13 can select the specific semiconductor switch 5 and limit the electric power supplied by the semiconductor switch 5. For example, the on and off instructions are input from the drive management unit 13 to each gate of the semiconductor switches 5(1) to 5(3). The semiconductor switches 5(1) to 5(3) supply the electric power to the connected load devices 2(1) to 2(3) in response to the on and off instructions. The load devices 2(1) to 2(3) are driven and controlled by the connected semiconductor switches 5(1) to 5(3), respectively.

Similarly to the first embodiment, The determination unit 12 determines the degradation states of the semiconductor switches 5(1) to 5(3) based on the actual temperature information and the estimated temperature information about the semiconductor switches 5(1) to 5(3). When it is determined that any one of the semiconductor switches 5(1)

to 5(3) is in the degradation state, the drive management unit 13 instructs to cut off the power supply of any one of the semiconductor switches 5 1) to 5(3) determined to be in the degradation state, and stops the operation of any one of the load devices 2(1) to 2(3). Preferably, the drive management unit 13 sets priorities corresponding to the degrees of importance of functions for the load devices 2(1) to 2(3), and stops the load devices 2(1) to 2(3) in descending order of priority.

The shunt resistor 10(1) detects the current of the semiconductor switch 5(1). Similarly, the shunt resistor 10(2) detects the current of the semiconductor switch 5(2), and the shunt resistor 10(3) detects the current of the semiconductor switch 5(3).

In the fifth embodiment, current detection signals are output from the plurality of shunt resistors 10(1) to 10(3), and signals representing voltage drops of the plurality of semiconductor switches 5(1) to (3) and actual temperature information 16 of the plurality of temperature detection elements 8 are output from the plurality of shunt resistors 10(1) to 10(3). The current detection signal and the signal indicating the voltage drop are input to the multiplexer 29(1). The actual temperature information 16 is input to the multiplexer 29(2).

A first selection unit (multiplexer 29(1)) selects the current detection signal detected by a plurality of current detection units (shunt resistors 10(1) to 10(3)) connected to each of the plurality of control targets (load devices 2(1) to 2(3)) for each of the plurality of current detection units (shunt resistors 10(1) to 10(3)), and outputs the selected current detection signal to the temperature estimation unit (temperature estimation unit 11). The controller 30E includes the multiplexer 29(1), signals input from the plurality of semiconductor switches 5(1) to 5(3) can be taken in by one interface. At this point, a selection signal selecting a signal of a required channel is input from the temperature estimation unit 11 to the multiplexer 29(1). The multiplexer 29(1) outputs the signal of the channel selected based on the selection signal to the temperature estimation unit 11. Then, the temperature estimation unit 11 outputs the estimated temperature information 15 to the determination unit 12 based on the input channel signal and the ambient temperatures of the semiconductor switches 5(1) to 5(3) input from the temperature sensor 14.

A second selection unit (multiplexer 29(2)) selects the actual temperature information about the actual temperature detected by the actual temperature detection unit (temperature detection element 8) included in the plurality of operation control units (semiconductor switches 5) connected to each of the plurality of control targets (load devices 2) for each of the plurality of operation control units (semiconductor switches 5(1) to 5(3)), and outputs the selected actual temperature information about the actual temperature to the determination unit (determination unit 12). The controller 30E includes the multiplexer 29(2), so that the signals input from the temperature detection elements 8 of the plurality of semiconductor switches 5(1) to 5(3) can be taken in by one interface. At this point, the multiplexer 29(2) selects the actual temperature information 16 about the channel selected by the multiplexer 29(1), and outputs the selected actual temperature information about the channel to the determination unit 12.

The determination unit 12 determines normality or abnormality for each of the semiconductor switches 5(1) to 5(3) based on the estimated temperature information 15 input from the temperature estimation unit 11 and the actual temperature information 16 input from the multiplexer 29(2). Then, the determination unit 12 outputs the determination result of the semiconductor switch 5 that determines the abnormality to the drive management unit 13. In the drive management unit 13, the semiconductor switch 5 in which the abnormality is determined limits the electric power supplied to the load device 2. At this point, when the determination unit (determination unit 12) determines that the state of the operation control unit (semiconductor switch 5) changes, the management unit (drive management unit 13) stops the electric power supplied from the operation control unit (semiconductor switch 5) to the control target (load device 2) having the low priority in the plurality of control targets (load devices 2). Even when the load device 2 having the low priority stops, the load device 2 having the high priority operates, so that it is avoided that the operation of the important load device 2 immediately stops.

In the power supply system 1A of the fifth embodiment described above, the plurality of load devices 2(1) to 2(3) are connected to the semiconductor switches 5(1) to 5(3), respectively. The control unit 3 takes in the signals output from the semiconductor switches 5(1) to 5(3) and the actual temperature information 16 selected by the multiplexers 29(1), 29(2), and determines the abnormal state of the semiconductor switch 5. As described above, the multiplexers 29(1), 29(2) are provided, so that the number of input interfaces of the control unit 3 can be reduced even when the number of semiconductor switches 5 is increased.

When the abnormality is generated in any of the semiconductor switches 5(1) to 5(3), the determination unit 12 can specify the semiconductor switch 5 in which the abnormality is generated. For this reason, the drive management unit 13 can output the on and off instructions to the semiconductor switches 5 while outputting the off instruction to other semiconductor switches 5 in which the abnormality is generated. As a result, the load device 2 connected to the semiconductor switch 5 in which the abnormal state is not detected can continue the operation.

Sixth Embodiment

Figure 14:
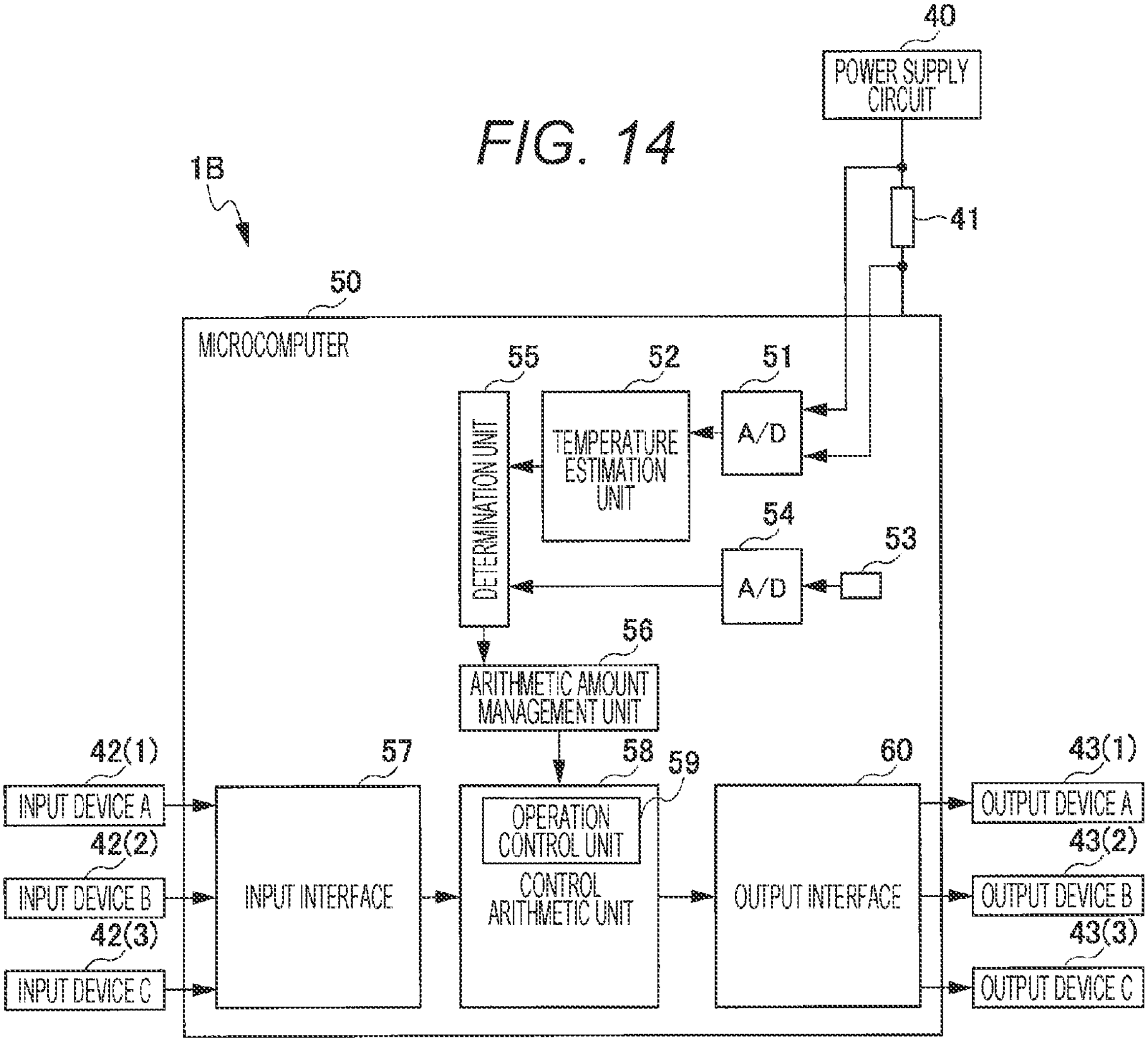
FIG. 14 is a schematic configuration diagram illustrating a power supply system according to a sixth embodiment of the present invention.

In the power supply system 1A of to the fifth embodiment described above, the semiconductor switch 5 that turns on and off the power supply of the actuator as the semiconductor element has been described. As other semiconductor elements, the present invention can also be applied to a switching element used for an inverter that controls drive torque of a microcomputer or a motor, a switching element used for a DC/DC converter, and the like. With reference to FIG. 14, a configuration example of a power supply system according to a sixth embodiment will be described below.

FIG. 14 is a schematic configuration diagram of a power supply system 1B of the sixth embodiment.

The power supply system 1B is obtained by applying the present invention to a microcomputer 50.

The power supply system 1B includes a power supply circuit 40, a shunt resistor 41, input devices 42(1) to 42(3), output devices 43(1) to 43(3), and the microcomputer 50. In FIG. 14, the input device 42(1) is described as an "input device A", the input device 42(2) is described as an "input device B", and the input device 42(3) is described as an "input device C". Furthermore, in FIG. 14, the output device 43(1) is described as an "output device A", the output device 43(2) is described as an "output device B", and the output device 43(3) is described as an "output device C".

The electric power is input from the power supply circuit 40 to the microcomputer 50. The shunt resistor 41 installed between the power supply circuit 40 and the microcomputer 50 outputs the detected current to the microcomputer 50. The shunt resistor 41 may be built in the microcomputer 50.

A microcomputer (microcomputer 50) includes an actual temperature detection unit (temperature sensor 53), a temperature estimation unit (temperature estimation unit 52), a determination unit (determination unit 55), a management unit (arithmetic amount management unit 56), an operation control unit (operation control unit 59), a control arithmetic unit (control arithmetic unit 58), an input interface (input interface 57), and an output interface (output interface 60). Furthermore, the microcomputer 50 includes A/D conversion units 51, 54.

Input signals are input to the input interface 57 from input devices 42(1) to 42(3) such as sensors and switches.

A control target of the sixth embodiment is the control arithmetic unit (control arithmetic unit 58) that outputs an arithmetic result obtained by performing predetermined arithmetic processing based on input data input from an input device (input devices 42(1) to 42(3)) through the input interface (input interface 57) to an output device (output devices 43(1) to 43(3)) through the output interface (output interface 60). The control arithmetic unit 58 executes the predetermined arithmetic processing corresponding to the input device 42 based on the input signal received through the input interface 57. The control arithmetic unit 58 outputs an execution result of the arithmetic processing to the output interface 60.

At this point, the control arithmetic unit 58 includes an operation control unit 59 that limits some functions of the control arithmetic unit 58 based on an instruction signal input from the arithmetic amount management unit 56. The operation control unit (operation control unit 59) controls an arithmetic amount of arithmetic processing performed by the control arithmetic unit (control arithmetic unit 58).

The output interface 60 outputs output signals to the output devices 43(1) to 43(3) such as a motor and a heater based on the execution result of the arithmetic processing.

A current detection signal of the current detected by the shunt resistor 41 is input to the A/D conversion unit 51.

The A/D conversion unit 51 outputs the current detection signal obtained by converting an analog current detection signal into digital data to the temperature estimation unit 52.

The temperature estimation unit (temperature estimation unit 52) estimates the internal temperature of the control arithmetic unit (control arithmetic unit 58) based on the current detection signal input from a current detection unit (shunt resistor 41) that detects the current supplied from a power supply unit (power supply circuit 40) to the operation control unit (operation control unit 59) and the thermal resistance and the heat capacity of the constituent members of the operation control unit (operation control unit 59). At this time, the temperature estimation unit 52 estimates the temperature around the microcomputer 52 based on the current detection signal, and outputs the estimated temperature information to the determination unit 55. At this point, the temperature estimation 52 unit operates the estimated temperature information from the power consumption of the microcomputer 50 and a heat radiation model according to the package or mounting form of the microcomputer 50.

On the other hand, the actual temperature information actually measured by the temperature sensor 53 provided inside the microcomputer 50 is converted into the digital data by the A/D conversion unit 54 and output to the determination unit 55 as actual temperature information.

The determination unit (determination unit 55) compares the temperature difference added to the estimated temperature with the overtemperature threshold, and determines the state of the operation control unit (operation control unit 59) as either the normal state or the heat radiation failure state.

For example, similarly to the determination unit 12 of the first embodiment, the determination unit 55 compares the estimated temperature information with the actual temperature information. Then, it is determined whether the package of the microcomputer 50 is degraded, that is, whether the microcomputer 50 is in the abnormal state.

The control arithmetic unit 58 changes the heat generation according to the arithmetic amount of the arithmetic processing. Thus, the management unit (arithmetic amount management unit 56) instructs the operation control unit (operation control unit 59) to limit the arithmetic amount of the arithmetic processing based on the determination result by the determination unit (determination unit 55). At this point, when the state of the operation control unit (operation control unit 59) is determined to be the heat radiation failure state, the management unit (arithmetic amount management unit 56) issues the instruction to limit the arithmetic amount of the arithmetic processing performed by the control arithmetic unit (control arithmetic unit 58) more than the normal state.

When the determination unit 55 determines that the microcomputer 50 is in the normal state, the arithmetic amount management unit 56 does not limit the arithmetic amount of the control arithmetic unit 58.

On the other hand, when the determination unit 55 determines that the microcomputer 50 is in the degradation state, the arithmetic amount management unit 56 instructs to limit the arithmetic amount of the control arithmetic unit 58. At this point, the arithmetic amount management unit 56 sets priority to the arithmetic processing of the control arithmetic unit 58 and instructs the operation control unit 59 to limit the arithmetic amount so as to stop the arithmetic processing having the low priority.

The operation control unit (operation control unit 59) limits the arithmetic amount of the arithmetic processing performed by the control arithmetic unit (control arithmetic unit 58) based on the instruction. Because the arithmetic processing having the low priority is stopped, an important control function of the microcomputer 50 is maintained. As described above, the operation control unit 59 limits the arithmetic amount of the control arithmetic unit 58 and restrains the power consumption of the control arithmetic unit 58, whereby the stop of the microcomputer 50 can be avoided. The management unit (arithmetic amount management unit 56) further instructs to stop the arithmetic processing by the control arithmetic unit (control arithmetic unit 58) when it is determined that the heat radiation failure progresses. In this case, the operation control unit 59 safely stops the arithmetic processing of the control arithmetic unit 58.

For example, the power supply system of each of the above-described embodiments may be used for an engine ECU and a powertrain integrated ECU of a hybrid vehicle. In addition, for example, the power supply system may be used in a zone integration ECU in zone architecture of an electrical/electronic (E/E) system of a vehicle.

In addition, the controller of each of the above-described embodiments may be applied to a calibration technique in a mass production line. In the mass production line, it is important to match the estimated temperature information about the semiconductor switch to be estimated with the actual temperature information based on the thermal model in FIG. 3. Thus, when there is a difference between the temperature estimated by the controller of each embodiment and the actual temperature obtained by actual measurement, the calibration such as correcting the thermal model such that the estimated temperature is matched with the actual temperature can be performed.

The present invention is not limited to each embodiment described above, but various other application examples and modifications can be taken without departing from the gist of the present invention described in the claims.

For example, the above-described embodiments describe the configurations of the device and the system in detail and specifically in order to describe the present invention in an easy-to-understand manner, and are not necessarily limited to those having all the described configurations. In addition, a part of the configuration of the embodiment described here can be replaced with the configuration of another embodiment, and furthermore, the configuration of another embodiment can be added to the configuration of a certain embodiment. Furthermore, another configuration can be added to, deleted from, and replaced with other configurations for a part of the configuration of each embodiment.

The control line and the information line indicate those which are considered required for the description, but do not necessarily indicate all the control lines and information lines that are required for the product. Actually, it can be considered that almost all the configurations are connected to each other.

REFERENCE SIGNS LIST

1 power supply system
2 load device
3 control unit
4 battery
5 semiconductor switch
6 power semiconductor
7 gate drive circuit
8 temperature detection element
9*a*, 9*b* power line
10 shunt resistor
11 temperature estimation unit
12 determination unit
13 drive management unit
14 temperature sensor
15 estimated temperature information
16 actual temperature information
17 drive instruction
30 controller

The invention claimed is:

1. A vehicle control device comprising:

an operation control unit that controls an operation of a control target to which electric power is supplied from a power supply unit;

an actual temperature detection unit that detects an internal temperature of the operation control unit as an actual temperature;

a temperature estimation unit that estimates the internal temperature as an estimated temperature based on current supplied to the operation control unit;

a determination unit that outputs a determination result determining a heat radiation failure of the operation control unit based on a temperature difference between the actual temperature and the estimated temperature;

wherein the determination unit compares the temperature difference with a plurality of thresholds to determine a state transition of the operation control unit among a normal state, a heat radiation failure state, and a heat radiation failure progression state;

a management unit that manages the operation of the operation control unit such that the actual temperature becomes less than an overtemperature threshold and continues the operation of the operation control unit when the determination result that the heat radiation failure is generated in the operation control unit is obtained, wherein the management unit limits the electric power supplied to the control target by the operation control unit more than the electric power supplied in the normal state when it is determined that the state of the operation control unit is the heat radiation failure state, and stops the electric power supplied to the control target by the operation control unit when it is determined that the state of the operation control unit is the heat radiation failure progression state.

2. A vehicle control device comprising:

an operation control unit that controls an operation of a control target to which electric power is supplied from a power supply unit;

an actual temperature detection unit that detects an internal temperature of the operation control unit as an actual temperature;

a temperature estimation unit that estimates the internal temperature as an estimated temperature based on current supplied to the operation control unit;

a determination unit that outputs a determination result determining a heat radiation failure of the operation control unit based on a temperature difference between the actual temperature and the estimated temperature; and a management unit that manages the operation of the operation control unit such that the actual temperature becomes less than an overtemperature threshold and continues the operation of the operation control unit when the determination result that the heat radiation failure is generated in the operation control unit is obtained; and further comprising a current detection unit that detects the current supplied from the power supply unit to the operation control unit, wherein the temperature estimation unit estimates the estimated temperature based on a current detection signal output from the current detection unit and thermal resistance and heat capacity of a constituent member of the operation control unit, the determination unit compares the temperature difference added to the estimated temperature with the overtemperature threshold, and determines a state of the operation control unit as either a normal state or a heat radiation failure state, and the management unit limits the electric power supplied to the control target by the operation control unit more than the electric power supplied in the normal state when it is determined that the state of the operation control unit is the heat radiation failure state, and stops the electric power supplied to the control target by the operation control unit when it is determined that the heat radiation failure further progresses.

3. The vehicle control device according to claim 2, wherein the operation control unit is a semiconductor switch that controls the electric power supplied to the control target, and the determination unit determines the constituent member in which an abnormality is generated based on a change in the temperature difference for each constituent member of the semiconductor switch after energization of the semiconductor switch is started.

4. The vehicle control device according to claim 3, wherein the current detection unit is a shunt resistor connected in series to the semiconductor switch, and the temperature estimation unit detects current supplied to the semiconductor switch based on voltage across the shunt resistor.

5. The vehicle control device according to claim 4, wherein the shunt resistor is provided between the power supply unit and the semiconductor switch.

6. The vehicle control device according to claim 5, wherein the actual temperature detection unit is any one of a diode element, a resistance element, and a thermistor element that are provided on a semiconductor substrate configuring the semiconductor switch.

7. The vehicle control device according to claim 3, wherein the semiconductor switch includes a current sense MOS FET that detects the current supplied to the semiconductor switch as the current detection unit.

8. The vehicle control device according to claim 3, wherein the semiconductor switch includes a current sense MOS FET that detects the current supplied to the semiconductor switch as the current detection unit, and the actual temperature detection unit outputs actual temperature information about the actual temperature that is operated based on a change in on-resistance of the current sense MOS FET to the determination unit.

9. The vehicle control device according to claim 3, further comprising an operation monitoring unit that monitors an operation of an overtemperature protection unit to cut off the semiconductor switch, and outputs a cutoff operation detection result to the determination unit when the cutoff operation of the semiconductor switch is performed, wherein the actual temperature detection unit is any one of a diode element, a resistance element, and a thermistor element that are provided on a semiconductor substrate configuring the semiconductor switch, the semiconductor switch includes the overtemperature protection unit that cuts off the semiconductor switch when the actual temperature detected by the actual temperature detection unit reaches the overtemperature threshold, and the determination unit determines the heat radiation failure state of the semiconductor switch based on the cutoff operation detection result input from the operation monitoring unit.

10. The vehicle control device according to claim 4, wherein a plurality of the control targets to which the electric power is supplied from the operation control unit are connected to the management unit, and the management unit stops the electric power supplied from the operation control unit to the control target having a lower priority in the plurality of control targets when the determination unit determines that the state of the operation control unit changes.

11. The vehicle control device according to claim 4, further comprising a plurality of second operation control units that are provided for each of the plurality of control targets and supply the electric power supplied from the operation control unit to the control target, wherein the management unit stops the electric power supplied to the control target by the second operation control unit to the second operation control unit connected to the control target having a lower priority in the plurality of control targets when the operation control unit limits the electric power supplied to the control target based on the determination result.

12. The vehicle control device according to claim 4, further comprising:

a first selection unit that selects, for each of a plurality of the current detection unit, the current detection signal detected by the plurality of current detection units connected to each of a plurality of the control targets and outputs the selected current detection signal to the temperature estimation unit; and a second selection unit that selects, for each of a plurality of the operation control unit, actual temperature information about the actual temperature detected by the actual temperature detection units included in the plurality of operation control units connected to each of the plurality of control targets, and outputs the actual temperature information to the determination unit, wherein the plurality of control targets to which the electric power is supplied from the plurality of operation control units are connected to the management unit, and the management unit stops the electric power supplied from the operation control unit to the control target having a lower priority in the plurality of control targets when the determination unit determines that the state of the operation control unit changes.

13. The vehicle control device according to claim 1, wherein the control target is a control arithmetic unit that outputs an arithmetic result obtained by performing predetermined arithmetic processing based on input data input from an input device through an input interface to an output device through an output interface, a microcomputer including the actual temperature detection unit, the temperature estimation unit, the determination unit, the management unit, the operation control unit, the control arithmetic unit, the input interface, and the output interface is configured, the operation control unit controls an arithmetic amount of the arithmetic processing performed by the control arithmetic unit, the management unit instructs the operation control unit to limit the arithmetic amount of the arithmetic processing based on the determination result by the determination unit, and the operation control unit limits the arithmetic amount of the arithmetic processing performed by the control arithmetic unit based on an instruction from the management unit.

14. The vehicle control device according to claim 13, wherein the temperature estimation unit estimates the estimated temperature of the control arithmetic unit including the operation control unit based on the current detection signal input from the current detection unit that detects the current supplied from the power supply unit to the operation control unit and thermal resistance and heat capacity of a constituent member of the operation control unit, and the management unit issues an instruction to limit the arithmetic amount performed by the control arithmetic unit more than the normal state when it is determined that the state of the operation control unit is the heat radiation failure state, and issues an instruction to stop the arithmetic processing by the control arithmetic unit when it is determined that the state of the operation control unit is in the heat radiation failure progression state.

* * * * *